United States Patent [19]
Torii et al.

[11] Patent Number: 5,521,148
[45] Date of Patent: * May 28, 1996

[54] OXIDE SUPERCONDUCTING MATERIAL, PROCESS FOR PREPARING THE SAME AND APPLICATIONS THEREOF

[75] Inventors: Yasuko Torii; Kengo Ohkura; Toshihiro Kotani, all of Osaka, Japan

[73] Assignee: Sumitomo Electric Industries, Ltd., Osaka, Japan

[ * ] Notice: The portion of the term of this patent subsequent to Feb. 2, 2014, has been disclaimed.

[21] Appl. No.: 771,839

[22] Filed: Oct. 8, 1991

Related U.S. Application Data

[63] Continuation of Ser. No. 446,363, Dec. 5, 1989, abandoned.

[30] Foreign Application Priority Data

| Dec. 5, 1988 | [JP] | Japan | 63-307537 |
| Mar. 30, 1989 | [JP] | Japan | 1-078976 |
| Nov. 17, 1989 | [JP] | Japan | 1-299387 |
| Nov. 20, 1989 | [JP] | Japan | 1-301315 |
| Nov. 21, 1989 | [JP] | Japan | 1-302776 |
| Nov. 21, 1989 | [JP] | Japan | 1-302777 |
| Nov. 22, 1989 | [JP] | Japan | 1-306790 |
| Nov. 27, 1989 | [JP] | Japan | 1-307944 |
| Nov. 30, 1989 | [JP] | Japan | 1-312962 |
| Dec. 1, 1989 | [JP] | Japan | 1-312572 |

[51] Int. Cl.⁶ .......................... H01B 12/00; H01L 39/12
[52] U.S. Cl. .................. 505/120; 505/121; 505/125; 505/782; 505/783; 505/879; 252/518; 252/521
[58] Field of Search .................... 505/100, 782, 505/783, 120, 121, 125, 879; 252/518, 521

[56] References Cited

U.S. PATENT DOCUMENTS 4,894,361  1/1990  Subramanian ..................... 502/123

FOREIGN PATENT DOCUMENTS

| 0344406 | 12/1989 | European Pat. Off. |
| 9101941 | 2/1991 | European Pat. Off. ........ C01F 11/02 |

OTHER PUBLICATIONS

Beyers "Crystallography and microstructure of Tl–Ca–Ba–Cu–O . . ."*Appl Phys Lett.* v. 53(5) Aug. 1, 1988 pp. 432–434.

Domengis "HREM study of the 120K–superconductor . . ." *Solid State Comm.* v. 68(3) 1988 pp. 303–308.

Haldar et al. "A new High–Tc Superconductor Containing . . . " *J. of Superconductivity* v. 1(2) Oct. 11, 1988 pp. 211–218.

Manthiram "Dependence of $T_c$ on hole concentration in the . . . " *Appl. Phys. Lett.* v. 53(5) Aug. 1, 1988 pp. 420–422.

Yoshizaki "Superconductivity and magnetic properties of $Bi_2Sr_2Ca_{1-x}Y_xCu_2O_y$," *Physica C* v. 152 May 1988 pp. 408–412.

Fukushima "Electrical and Magnetic Properties in $Bi_2Sr_2Ca_{1-x}Y_xCu_2O_x$," *Jap. Jnl. App. Phys.* vol. 27(8) Aug. 1988 pp. L1432–L1434.

Che "Composition and Superconductivity in Bi–Sr–Ca–Cu–O . . . " *Jnl. of Mat'l Sci.* v. 24 May 1989 pp. 1725–1727.

(List continued on next page.)

*Primary Examiner*—Paul Lieberman
*Assistant Examiner*—M. Kopec
*Attorney, Agent, or Firm*—Sughrue, Mion, Zinn, Macpeak & Seas

[57] ABSTRACT

Novel superconducting oxide material containing compound oxide having a composition represented by the formula:

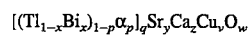

in which "α" is at least one element selected from a group consisting of In, Sn, Sb, Pb, Y and lanthanide elements and "x", "y", "z", "p", "q", and "v" are numbers each satisfying respective range of $0.1 \leq x \leq 0.5$, $0.5 \leq y \leq 4.0$, $0.5 \leq z \leq 4.5$, $0 \leq p \leq 0.6$, $0.5 \leq q \leq 3.0$, and $1.0 \leq v \leq 5.5$.

8 Claims, 15 Drawing Sheets

OTHER PUBLICATIONS

Ramesh "New Modulated Structure in a Pb–doped . . . " *Appl. Phys. Lett* v. 53(22) Nov. 28, 1988 pp. 2220–2222.

Chen "(TlBi)Sr CaCu O the 1212 phase" *J. Appl. Phys.* v., 65(9) May 1, 1989 pp. 3574–3578.

Haldar "A new intermediate–$T_c$ oxide superconductor . . . " *Materials Letters* v. 7(1,2) Aug. 1988 pp. 1–4.

Mizuno "Superconductivity of $Bi_2Sr_2Ca_2Cu_3Pb_xO_y$ . . . " *Jap. Jnl. Appl. Phys.* v. 27(7) Jul. 1988 pp. 1225–1227.

Yamada "Pb Introduction to the High–Tc Superconductor . . . " *Jap. Jnl. Appl. Phys.* v. 27 No. 6 Jun. 1988 pp. L996–998.

Takano "High–Tc Phase Promoted and Stabilized in the . . . " *Jap. Jnl. Appl. Phys.* v. 27(6) Jun. 1988 pp. L1041–L1045.

Togano "Properties of Pb–doped Bi—Sr–Ca–Ca–O super . . . " *Appl. Phys. Lett.* v. 53(14) Oct. 3, 1988 pp. 1329–1331.

P. Haldar et al., "A New High–$T_c$ Superconductor . . . Phase $(Tl_{1-x}Bi_{x1.33}Sr_{1.33}Ca_{1.33}Cu_2O_{6.67+\delta}$", Journal of Superconductivity, vol. 1, No. 2, Jun. 1988, pp. 211–218.

Subramanian et al., "Bulk Superconductivity up to 122 K in the Tl–Pb–Sr–Ca–Cu–O System", Science, vol. 242, No. 4876, Oct. 14, 1988, pp. 249–252.

Physica C, vol. 156, No. 5, 1st Dec. 1988, pp. 788–790, Amsterdam, NL; A. K. Ganguli et al.: "Tl1–xPbxCaSr2Cu2O7 another 1122 high–Tc superconductor".

Japanese Journal of Applied Physics, vol. 27, No. 6, Jun. 1988, pp. L1077–L1079, Tokyo, JP; T. Nagashima et al.: "Superconductivity in Tl1.5SrCaCu2Ox".

Physica C, vol. 156, No. 5, 1st Dec. 1988, pp. 791–794, Amsterdam, NL; R. S. Liu et al.: "A new high–Tc superconducting Tl–Pb–Ca–Sr–Cu–O system".

Fujikura Technical Review, No. 17, Feb. 1988, pp. 1–4, Tokyo, JP; H. Osani et al.: "High temperature superconducting oxide wires".

DRAWING OF
PHOTO OF SINGLE CRYSTAL OF Tl-Bi-Ca-Cu-O
SYSTEM BY SEM

LOW Tc PHASE

Tl-Bi
SYSTEM

100 μm

HIGH Tc PHASE

100 μm

Tl-Bi-Pb
SYSTEM

100 μm

100 μm

OXIDE SUPERCONDUCTING MATERIAL, PROCESS FOR PREPARING THE SAME AND APPLICATIONS THEREOF

This is a continuation of application Ser. No. 07/446,363, filed Dec. 5, 1989, now abandoned.

BACKGROUND OF THE INVENTION

1. Field of the Invention

The present invention relates to superconducting oxide materials and processes for preparing the same. More particularly, it relates to superconducting oxide materials containing Tl and/or Bi having high superconducting critical temperature (Tc) and high superconducting critical current density (Jc), processes for preparing the same and their applications as wires or magnets.

2. Description of the Related Art

Discovery of new oxide type superconductor by Bednorz and Müller revealed the possibility of high temperature superconductors (Z. Phys. B64, 1986 p 189) and study to find much higher Tc superconductors have been continued.

C. W. Chu et al. reported another superconducting material of so-called YBCO type represented by $YBa_2Cu_3O_{7-x}$ having the critical temperature of about 90 K. (Physical Review letters, Vol. 58, No. 9, p 908).

Maeda et al reported the other type new superconducting compound oxide of Bi-Sr-Ca-Cu-O system which show the critical temperature of more than 100 K. (Japanese Journal of Applied Physics. Vol. 27, No. 2, p 1209 to 1210). Tl-Ba-Ca-Cu-O system compound oxide reported by Hermann et al. in Appl. Phys. Lett. 52 (20) p 1738 is also a high Tc superconductor of about 120 K. The Tl-Ba-Ca-Cu-O system and Bi-Sr-Ca-Cu-O system oxide superconductors show very high critical temperatures which are sufficiently higher than boiling point of liquid nitrogen of 77 K. and hence are expected to be applicable to actual uses.

However, the critical current density (Jc) of these systems at 77 K., drops sharply under higher magnetic field of more than 1 T. In fact, the Bi-Sr-Ca-Cu-O system oxide is a mixture of a high Tc phase of 100 K. and a low Tc phase of 80 K. and it is difficult to separate them. The Tl-Ba-Ca-Cu-O system compound oxide also is composed of a plurality of different phases such as $Tl_2Ca_2Ba_2Cu_3O_x$ and $Tl_2Ca_1Ba_2Cu_3O_y$ and is extremely difficult to isolate the high Tc phase alone. In the case of Bi-Sr-Ca-Cu-O system oxide, it was proposed to add Pb to this system in order to obtain nearly 90% single phase of Bi-Pb-Sr-Ca-Cu-O system having a critical temperature of higher than 100 K. However, in order to obtain this Bi-Pb-Sr-Ca-Cu-O system, the material powder must be subjected to very time consuming sintering operation. Still more, the resulting sintered oxides show anisotropy in crystal structure and exhibit a very low critical current density under strong magnetic field.

Tl-Sr-Ca-Cu-O system compound is also reported. This system shows relatively lower critical temperature of 75 K.

An object of the present invention is to overcome the problems of the prior art and to provide improved superconducting materials which exhibit higher critical current density under strong external magnetic fields as well as high critical temperature, processes for preparing the same and their applications as superconducting wire and magnets.

Another object of the present invention is to provide a process for producing single crystals of these superconducting compound oxides.

SUMMARY OF THE INVENTION

The present invention provides a superconducting oxide material containing compound oxide having a composition represented by the formula:

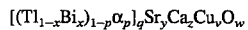

in which "α" is at least one element selected from a group consisting of In, Sn, Sb, Pb, Y and lanthanide elements and "x", "y", "z", "p", "q", and "v" are numbers each satisfying respective range of $0.1 \leq x \leq 0.5$, $0.5 \leq y \leq 4.0$, $0.5 \leq z \leq 4.5$, $0 \leq p \leq 0.6$, $0.5 \leq q \leq 3.0$, and $1.0 \leq v \leq 5.5$.

The expression "containing" means that the superconducting oxide material according to the present invention can may contain additional compound oxides. In fact, a bulk oxide superconductor usually may consist of more than one phase and the mixture of such phases can be used as a superconducting material in actual applications. Therefore, all compound oxides containing the compound oxide defined by the present invention are included in the scope of the present invention.

The superconducting oxide material according to the present invention preferably contain a compound oxide whose "x" is a number satisfying a range of $0.1 \leq x \leq 0.5$.

The superconducting oxide material according to the present invention preferably contains a crystalline compound oxide having a layered structure of a tetragonal system and having a composition represented by the general formula in which "y"=2±0.5, "z"=n±0.5 (n=1, 2, 3 or 4), "q"=m±0.5 (m=1 or 2) and "v"=(n+1)±0.5.

A preferable example of the superconducting oxide material according to the present invention is a Tl-Bi-Sr-Ca-Cu system compound oxide which is expressed by the general formula when "p"=0. In this Tl-Bi-Sr-Ca-Cu system, the "x", "y", "z", "q", "v" and "w" are numbers each satisfying following respective range:

$0 \leq x \leq 1.0$, $0.5 \leq y \leq 3.0$, more preferably $1.5 \leq y \leq 2.5$, $0.5 \leq z \leq 3.0$, more preferably $1.5 \leq z \leq 2.5$, $0.5 \leq q \leq 3.0$, more preferably $0.5 \leq q \leq 2.5$, $1.0 \leq v \leq 4.0$, more preferably $2.5 \leq v \leq 3.5$, and Another preferable example of the superconducting oxide material according to the present invention is a Tl-Bi-Pb-Sr-Ca-Cu system compound oxide which is expressed by the general formula when "α"=0. In this Tl-Bi-Pb-Sr-Ca-Cu system, the "x", "y", "z", "p", "q", "v" and "w" are numbers each satisfying following respective range:

$0 \leq x \leq 1.0$, $0.1 \leq p \leq 0.6$, $0.5 \leq y \leq 3.0$, more preferably $1.5 \leq y \leq 2.5$, $0.5 \leq z \leq 3.0$, more preferably $1.5 \leq z \leq 2.5$, $0.5 \leq q \leq 3.0$, more preferably $0.5 \leq q \leq 2.5$, $1.0 \leq v \leq 4.0$, more preferably $2.5 \leq v \leq 3.5$, and These Tl-Bi-Sr-Ca-Cu system and Tl-Bi-Pb-Sr-Ca-Cu system have preferably the range of "x" of $0.0 \leq x \leq 0.5$ in the general formula and are composed preferably of a layered crystal structure of a tetragonal system.

One of the most important properties of the superconducting oxide material according to the present invention is that the superconducting oxide material exhibits and maintains high critical current density even in strong magnetic field.

In fact, the superconducting oxide material according to the present invention exhibits such critical current density $Jc_{(B)}$ that satisfies the following equation:

$$0.5 \leq \frac{Jc_{(B)}}{Jc_{(0.2T)}} \leq 1.5$$

in which $Jc_{(0.2\ T)}$ is a critical current density determined when the intensity of magnetic field is 0.2 T while $Jc_{(B)}$ is a critical current density determined at any intensity (B) of magnetic field between 0.2 T≦B≦2 T.

In addition to or owing to this advantageous property, the superconducting oxide material according to the present invention have reduced anisotropy.

In fact, the superconducting elongated article made of the superconducting oxide material according to the present invention shows such a critical current density $Jc_{(\Theta, \phi)}$ that satisfies the following equation:

$$0.7 \leq \frac{Jc_{(\theta,\phi)}}{Jc_{max}} \leq 1$$

in which $Jc_{(\Theta, \phi)}$ is a critical current density determined at any intensity of magnetic field $B(\theta, \phi)$ while $Jc_{max}$ is the highest critical current density at the same intensity of magnetic field, wherein the magnetic field $B(\theta, \phi)$ is defined as a magnetic field applied to the elongated article from any direction, θ being an angle between the magnetic filed and a plane in which the current flow (0≦θ≦2π) and φ being an angle between the magnetic filed and the direction of current flow in the plane in which the current flow (0≦φ≦2π). Owing to this advantageous property, the superconducting oxide material according to the present invention can be shaped into a superconducting elongated article such as a wire which can be used for manufacturing a superconducting magnet.

The present invention provides processes for producing the superconducting material. The superconducting material according to the present invention can be produced by a variety of techniques such as sintering, thin film forming technique such as sputtering or MBE and single crystal growth.

When the sintering technique is used for preparing the superconducting material according to the present invention, it is preferable to adopt a two-step sintering technique according to the present invention.

For example, the Tl-Bi-Sr-Ca-Cu system superconducting compound oxide material is preferably prepared by the two-step sintering technique comprising a first sintering step for sintering a first powder material containing Sr, Ca and Cu in atomic ratios of Sr:Ca:Cu="y":"z":"v" in which "y", "z" and "v" are numbers each satisfies respective range 0.5≦y≦3.0, 0.5≦z≦4.0 and 1.0≦v≦5.0, and a second step for sintering a second powder material which is prepared by adding Tl and Bi to the sintered powder obtained in the first sintering step in atomic ratios of Tl:Bi:Sr:Ca:Cu="q(1−x)":"xq":"y":"z":"v", in which "x", "q", "p", "z" and "v" are numbers each satisfies respective range 0≦x≦1, 0.5≦q≦3.0, 0.5≦y≦3.0, 0.5≦z≦4.0 and 1.0≦v≦5.0 to obtain the superconducting material containing crystalline compound oxide having a composition represented by the formula:

$$(Tl_{1-x'}Bi_{x'})_{q'}Sr_{y'}Ca_{z'}Cu_{v'}O_{w'}$$

in which x', q', y', z' and v' are numbers each satisfying respective range of 0≦x'≦1, 0.5≦q'≦1.5, 1.5≦y'≦2.5, 1.5≦z'≦2.5 and 2.5≦v'≦3.5.

The Tl-Bi-Pb-Sr-Ca-Cu system superconducting compound oxide material is also prepared by the two-step sintering technique comprising a first sintering step for sintering a first powder material containing Sr, Ca and Cu in atomic ratios of Sr:Ca:Cu="y":"z":"v" in which "y", "z" and "v" are numbers each satisfies respective range 0.5≦y≦3.0, 0.5≦z≦4.0 and 1.0≦v≦5.0, and a second step for sintering a second powder material which is prepared by adding Tl, Bi and Pb to the sintered powder obtained in the first sintering step in atomic ratios of Tl:Bi:Pb:Sr:Ca:Cu="q(1−x−p)":"x-q":"pq":"y":"z":"v", in which "x", "p", "q", "y", "z" and "v" are numbers each satisfies respective range 0≦x≦1, 0≦p≦0.6, 0.5≦q≦3.0, 0.5≦y≦3.0, 0.5≦z≦4.0 and 1.0≦v≦5.0 to obtain the superconducting material containing crystalline compound oxide having a composition represented by the formula:

$$(Tl_{1-x'-p'}Bi_{x'}Pb_{p'})_{q'}Sr_{y'}Ca_{z'}Cu_{v'}O_{w'}$$

in which x', p', q', y', z' and v' are numbers each satisfying respective ranges of 0≦x'≦1, 0≦p'≦0.6, 0.5≦q≦1.5, 1.5≦y'≦2.5, 1.5≦z'≦2.5 and 2.5≦v'≦3.5.

The first and second sintering is preferably effected at a temperature between 700° and 1,000° C. for more than one hour in an oxygen-containing atmosphere. The second sintering operation is preferably carried out in a closed space.

The superconducting compound oxide according to the present invention can be obtained in a form of a single crystal by using a crystal growth method according to to the present invention.

When the single crystal of Tl-Bi-Sr-Ca-Cu-O system compound oxide is grown by the method according to the present invention, powders of oxides containing Tl, Bi, Sr, Ca and Cu are mixed in atomic ratios of (Tl+Bi):St:Ca:Cu=2:2:(n−1):n, in which Tl/Bi>1 and "n" is a number between 3 and 7 and are melt at 950° to 1,050° C. at first. After then, the resulting melt is cooled down at a cooling rate of 1° to 20° C./hour to ambient temperature. The product of this method is a single crystal growth represented by (Tl, Bi)$_1$Sr$_2$Ca$_2$Cu$_3$O$_w$ (w is a number of about 9).

Another superconducting compound oxide of Tl-Bi-Pb-Sr-Ca-Cu-O system also can be obtained by this single crystal growth method. In this system, powders of oxides containing Tl, Bi, Pb, Sr, Ca and Cu are mixed in atomic ratios of (Tl+Bi+Pb):St:Ca:Cu=2:2:(n−1):n, in which "n" is a number between 4 and 7 when Tl/(Bi+Pb)>1 and "n" is a number between 5 and 7 when Tl/(Bi+Pb)=1 and are melt at 950° to 1,050° C. After then, the resulting melt is cooled down at a cooling rate of 1° to 20° C./hour. The product of this method is a single crystal growth represented by (Tl, Bi, Pb)$_1$Sr$_2$Ca$_2$Cu$_3$O$_w$ (w is a number of about 9).

The superconducting compound material of oxide of Tl, Bi, (Pb), Sr, Ca and Cu according to the present invention can be prepared also by a process comprising subjecting a material powder containing Tl, Bi, (Pb), Sr, Ca and Cu to plastic deformation, and then subjecting the resulting deformed pre-form to heat-treatment.

In this process, the material powder can be a mixture of oxide and/or carbonate containing Tl, Bi, (Pb), Sr, Ca and Cu such as Tl$_2$O$_3$, Tl$_2$CO$_3$ or TlBaO$_3$. The plastic deformation can be carried out under such conditions that the material powder is packed in a metallic sheath made of precious metal such as silver, gold or their alloy. During the plastic deformation, the cross section of the metallic sheath is preferably reduced more than 10% and the plastic deformation is preferably effected under a load of more than 10 ton/cm$^2$. The plastic deformation can be carried out by means of roller, press, wire-drawing unit or the like. The heat-treatment is effected preferably at a temperature between 750° and 1,000° C. The metallic sheath is removed or not removed during the heat-treatment. The heat-treatment can be effected after the material powder or the metallic sheath is shaped into a desired configuration such as a coil or ring. The plastic deformation and the heat-treatment and a combination thereof is preferably repeated for several times.

In variation, the material powder itself can be a superconducting compound oxide powder which is prepared separately by the sintering process.

One of the important properties of the superconducting oxide material according to the present invention is that the superconducting oxide material contains a layered crystal structure of tetragonal system having one or two layers of Tl-O, (Tl, α)-O, (Tl, Bi)-O or (Tl, Bi, α)-O, in which "α" is at least one element selected from a group consisting of In, Sn, Sb, Pb, Y and lanthanide elements. The superconducting oxide material according to the present invention has a perovskite type crystal structure.

Another important property of the superconducting oxide material according to the present invention is that the superconducting oxide material exhibits very high critical current density (Jc) under strong magnetic field. In addition, such high critical current density (Jc) doesn't change even if the strength of the external magnetic field varies. This property may come from the fact that the superconducting oxide material according to the present invention consists mainly of high Tc phase. Owing to this important property, the the superconducting oxide material according to the present invention is suitable for producing superconducting wires.

Still another important property of the superconducting oxide material according to the present invention is that the superconducting oxide material can be obtained easily in a form of a single crystal having a composition of (Tl, Bi)$Sr_2Ca_2Cu_3O_w$ (w is a number of about 9) or (Tl, Bi, Pb)$Sr_2Ca_2Cu_3O_w$ (w is a number of about 9) by using a melt-glow method, which promotes much homogeneous reaction than a solid reaction or gas-phase reaction.

When such single crystal of high purity is not required, the superconducting oxide material according to the present invention can be obtained by using the sintering technique. The resulting sintered article or sintered powder can be used in a variety of practical applications or uses such as superconducting wire, york, coil, ring or the like. The sintering is preferably carried out by the two-step sintering process according to the present invention, because formation of lower Tc phases or non-superconducting phases is prevented by the two-steps sintering process.

As is described hereinabove, the oxide superconducting material according to the present invention exhibits much higher critical current density than the known oxide superconductors such as Bi-Sr-Ca-Cu-O system and Tl-Sr-Ca-Cu-O system while they exhibit the same or even higher critical temperature with respect to such known oxide superconductors. It is thought that such advantage might be obtained from such facts that the superconducting oxide materials according to the present invention have a novel layered crystal structure of tetragonal system having one or two layers of Tl-O, (Tl, Pb)-O, (Tl, Bi)-O or (Tl, Pb, Bi, α)-O, in which α is at least one element selected from a group consisting of In, Sn, Sb, Pb, Y and lanthanide elements: and, that the superconducting oxide materials according to the present invention are obtainable in a single phase form very easily.

One of the very important properties or characteristics of the superconducting oxide materials according to the present invention resides in that the critical current density can be maintained at a relatively constant value even if the external magnetic field is changed and is less sensitive to the direction of the magnetic field. This feature is very advantageous in the application as magnetic coils.

BRIEF DESCRIPTION OF THE DRAWING

FIG. 16($b$) is a photo of of the high To phase of the single crystal of superconducting oxide of (Tl, Bi)$Sr_2Ca_2Cu_3O_w$ by Scanning electron Microscope.

FIG. 16($c$) is a photo of of the low Tc phase of the single crystal of superconducting oxide of (Tl, Bi, Pb)$Sr_2Ca_2Cu_3O_w$ by Scanning electron Microscope.

FIG. 16($d$) is a photo of of the high To phase of the single crystal of superconducting oxide of (Tl, Bi, Pb)$Sr_2Ca_2Cu_3O_w$ by Scanning electron Microscope.

DESCRIPTION OF THE PREFERRED EMBODIMENTS

Now, the present invention will be described in more detail by examples, but the scope of the present invention should not limited to the following special examples.

EXAMPLE 1

Single Crystal Growth of $(Tl, Bi)Sr_2Ca_2Cu_3O_w$

Powders of $Tl_2O_3$, $Bi_2O_3$, SrO, CaO and CuO were mixed in atomic ratios of $(Tl+Bi):Sr:Ca:Cu=2:2:(n-1):n$, in which $Tl/Bi=3$, "n" was selected as n=3, 4, 5, 6 and 7. The resulting powder mixture was packed in a tube made of gold.

Figure 1:
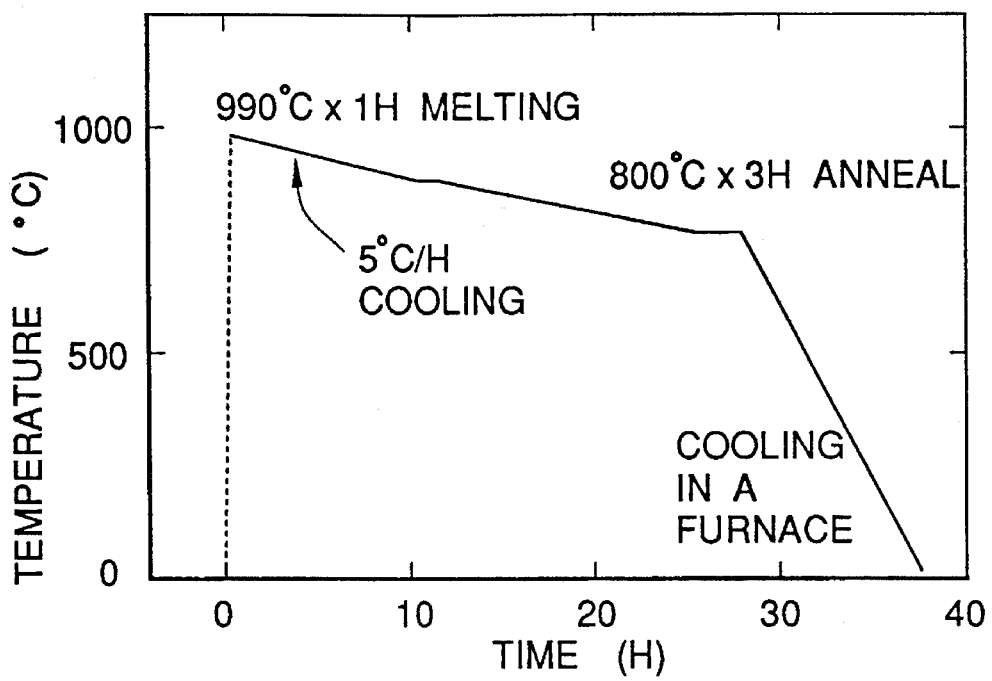
FIG. 1 shows a temperature curve which was programmed to obtain single crystals of oxides represented by (Tl, Bi)$Sr_2Ca_2Cu_3O_w$ and (Tl, Bi, Pb)$Sr_2Ca_2Cu_3O_w$ prepared in Example 1 and 2.

After the gold tube was closed, the gold tube was placed in a furnace and was heated according to a heating program shown in FIG. 1. Namely, the powder mixture was heated up to 1,000° C. to obtain a melt and then the melt was cooled at a cooling rate of 5° C./hr down to 800° C. After then, the temperature of 800° C. was maintained for 3 hours to anneal the product. After this annealing, the product was left in the furnace de-energized until the product was cooled down to ambient temperature.

The critical temperature was determined by DC magnetic susceptibility measurement. Table 1 shows the result.

TABLE 1

| n | 3 | 4 | 5 | 6 | 7 |
|---|---|---|---|---|---|
| critical temperature (K) | 107 | 108 | 110 | 106 | 105 |

Figure 2:
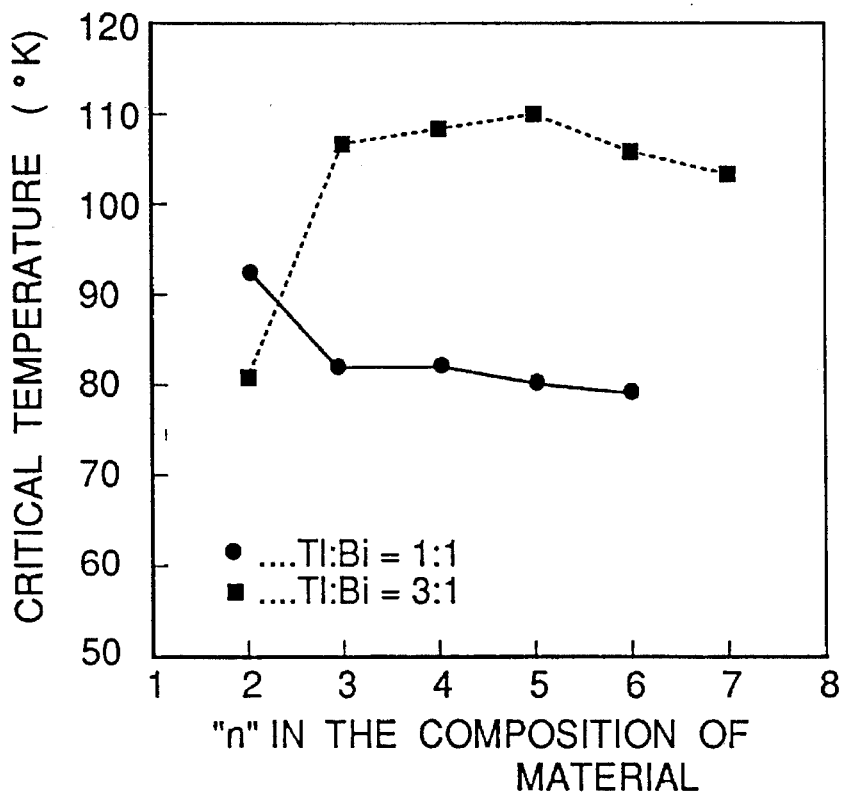
FIG. 2 shows a relation between the critical temperature (Tc) and a value "n" in a composition of (Tl, Bi)SrCaCuO system oxides.

FIG. 2 shows the relation between the critical temperatures (K.) with respect to a variation of "n".

Figure 3:
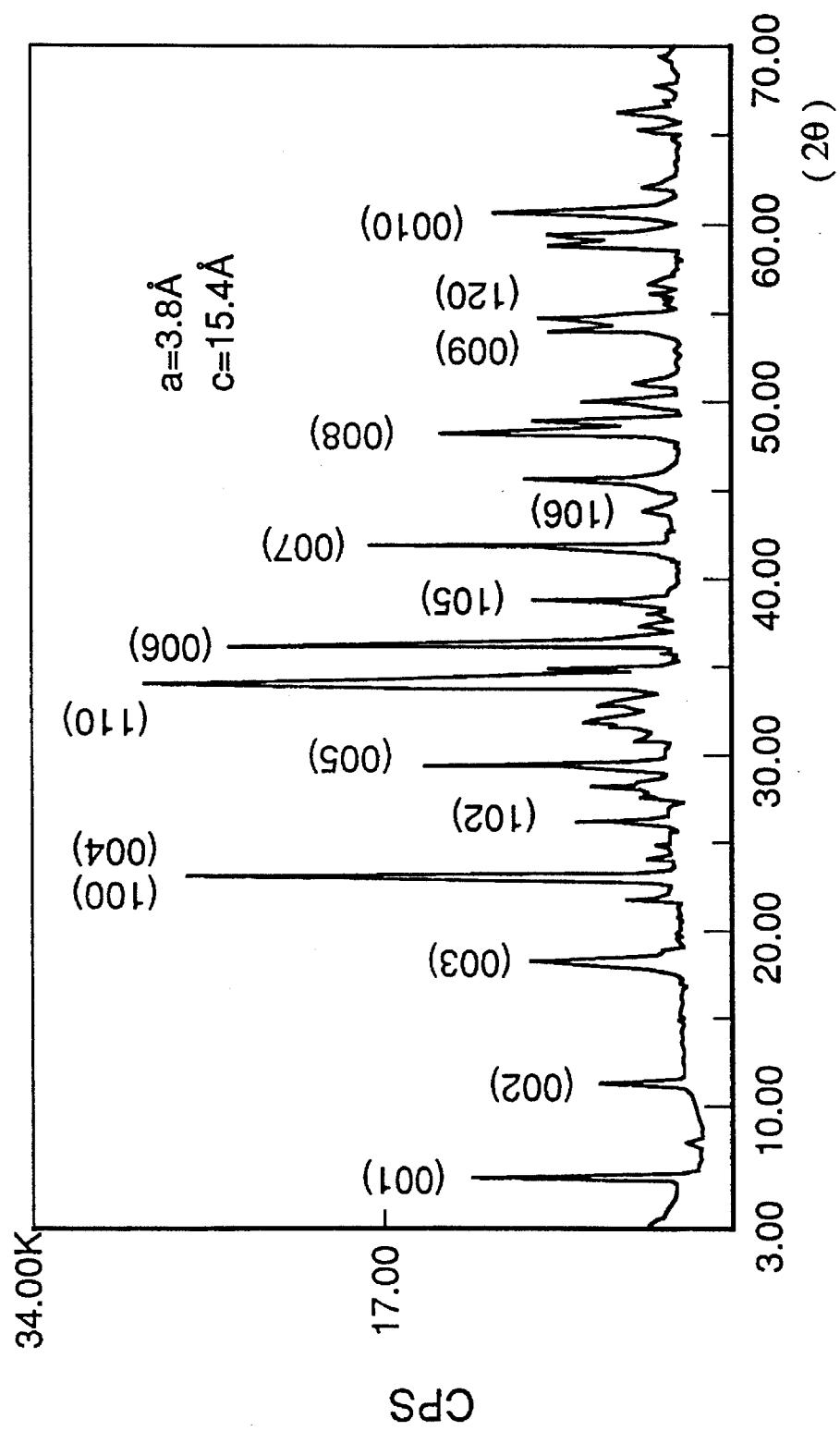
FIG. 3 is a X-ray diffraction chart of a high Tc phase of (Tl, Bi)$Sr_2Ca_2Cu_3O_w$ in the single crystal
Figure 4:
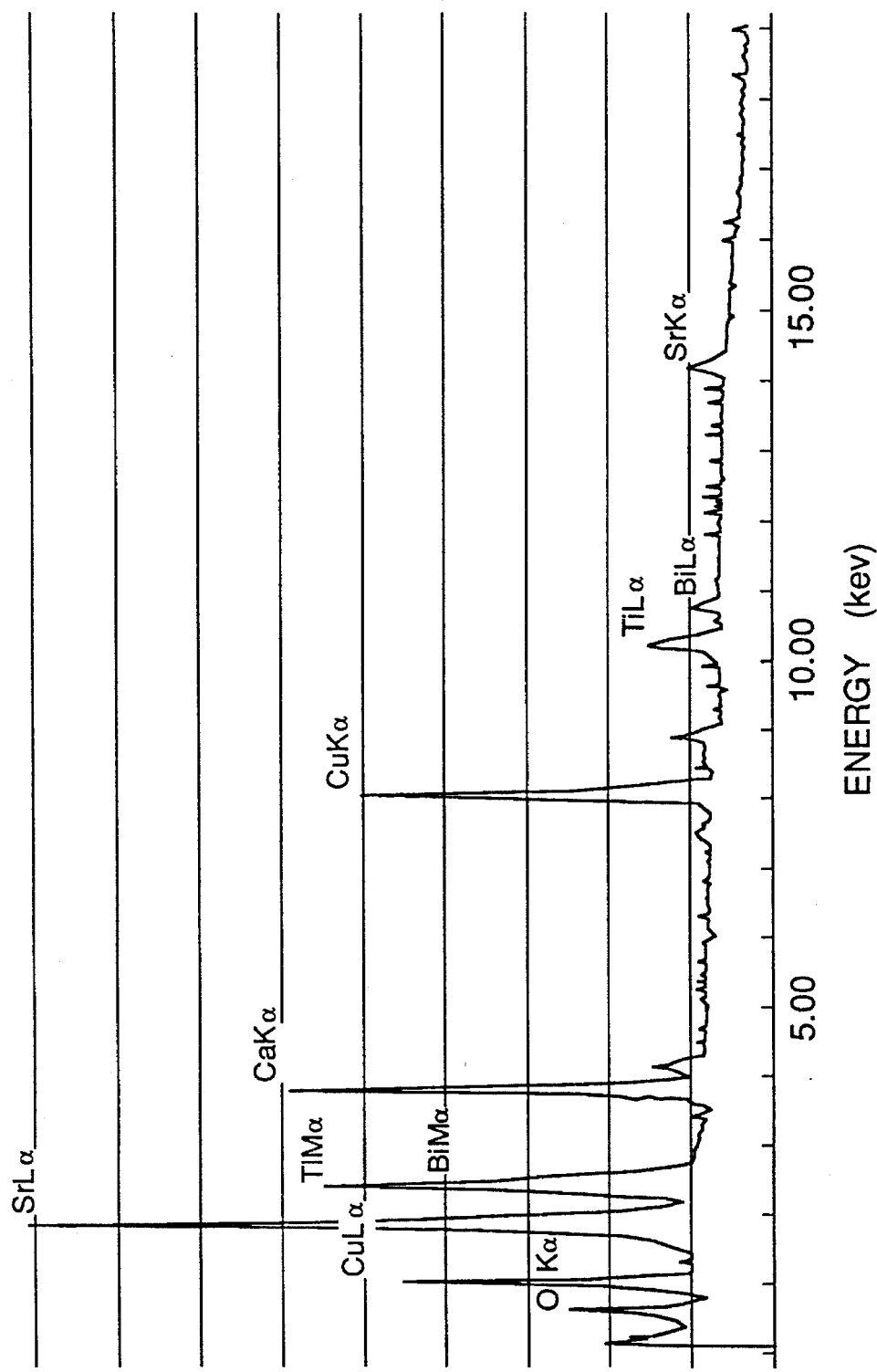
FIG. 4 is a chart obtained by an energy dispersive X-ray spectrometer and shows a composition of the high Tc phase of (Tl, Bi)$Sr_2Ca_2Cu_3O_w$ in the single crystal.

The resulting crystal was analyzed by X-ray diffraction to find that the resulting crystal was a single crystal represented by $(Tl, Bi)_1Sr_2Ca_2Cu_3O_w$. FIG. 3 is a X-ray diffraction pattern of a typical sample.

The composition of the resulting crystal was analyzed by an energy dispersive X-ray spectrometer. Table 2 shows a composition of the typical sample determined by the energy dispersive X-ray spectrometer and FIG. 3 is a powder X-ray diffraction analysis of the sample.

TABLE 2

| Element | Tl | Bi | Sr | Ca | Cu |
|---|---|---|---|---|---|
| atomic ratio | 0.8 | 0.3 | 1.8 | 2.0 | 3.0 |

As comparative examples, the same procedure as above was repeated but the atomic ratios was changed as following:

Tl/Bi=1 and "n"=2, 3, 4, 5 and 6 and

Tl/Bi=3 and "n"=2.

The resulting critical temperatures (K.) are summarized in the FIG. 2. As is shown in FIG. 2, the critical temperatures are relatively lower (75 to 85 K.). A composition of a sample (Tl/Bi=3 and "n"=2) in these crystals determined by an energy dispersion type X-ray analyzer is shown in Table 3.

TABLE 3

| Element | Tl | Bi | Sr | Ca | Cu |
|---|---|---|---|---|---|
| atomic ratio | 0.8 | 0.3 | 1.7 | 1.0 | 2.0 |

Figure 5:
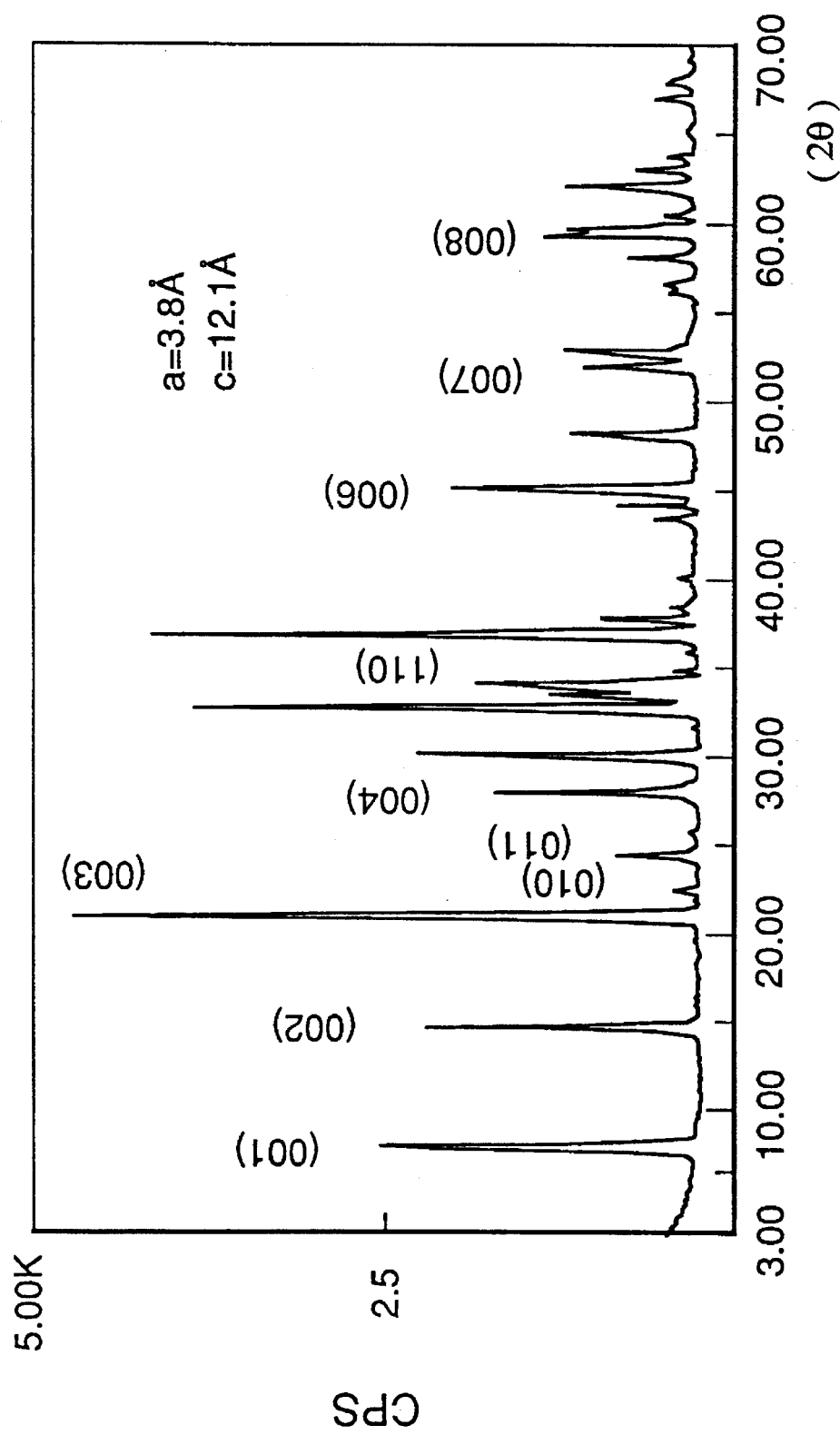
FIG. 5 is a X-ray diffraction chart of a low Tc phase of (Tl, Bi)$Sr_2Ca_2Cu_3O_w$ in the single crystal.
Figure 6:
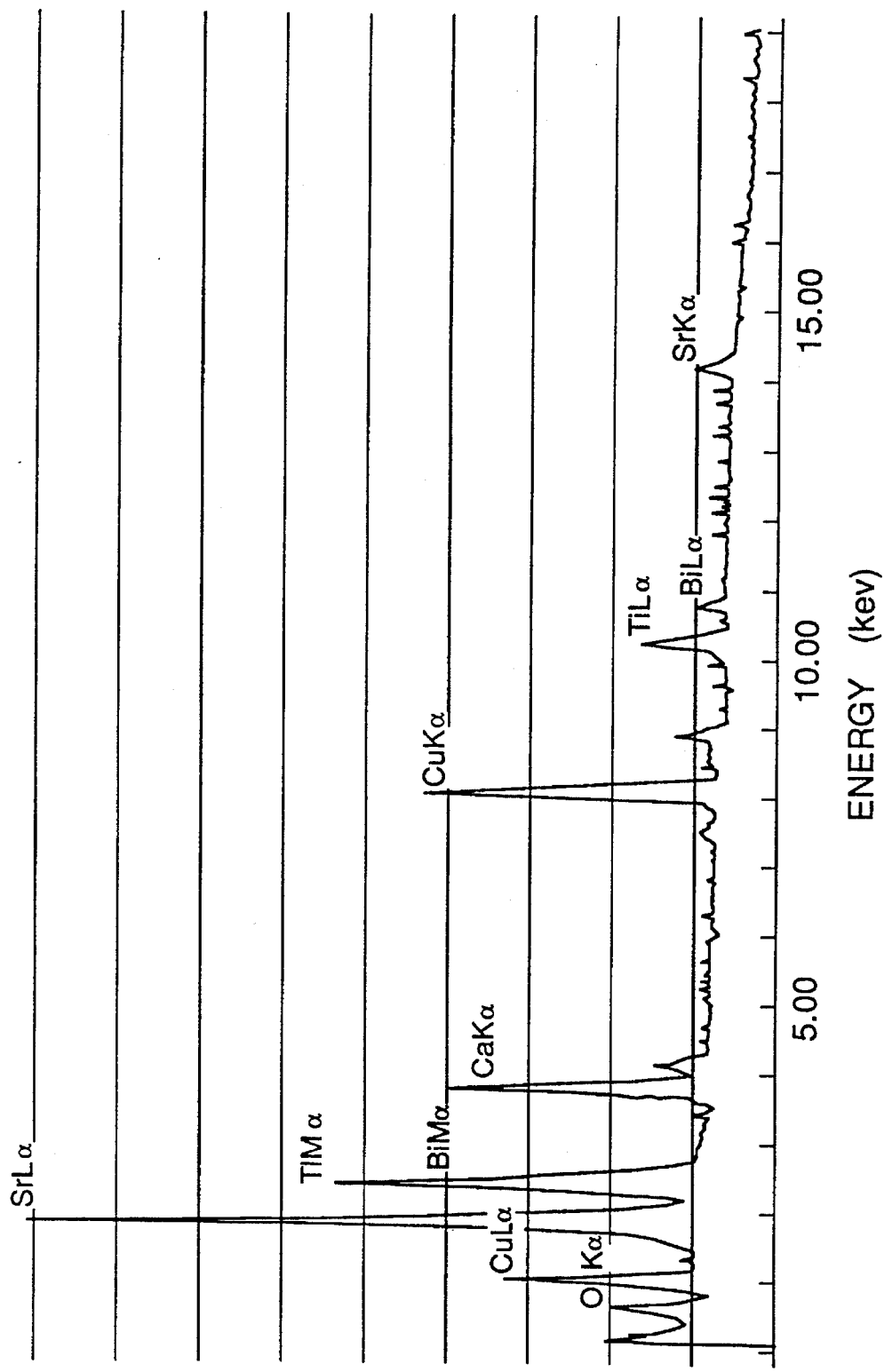
FIG. 6 is a chart obtained by an energy dispersive X-ray spectrometer and shows a composition of the low Tc phase of (Tl, Bi)$Sr_2Ca_2Cu_3O_w$ in the single crystal.

FIG. 5 is X-ray diffraction pattern of this sample (Tl/Bi=3 and "n"=2) and FIG. 6 is FIG. 3 is a pattern of the energy dispersion type X-ray diffraction analysis of this sample.

Figure 16A:
FIG. 16($a$) is a photo of of the low To phase of the single crystal of superconducting oxide of (Tl, Bi)$Sr_2Ca_2Cu_3O_w$ by Scanning electron Microscope.
Figure 16B:
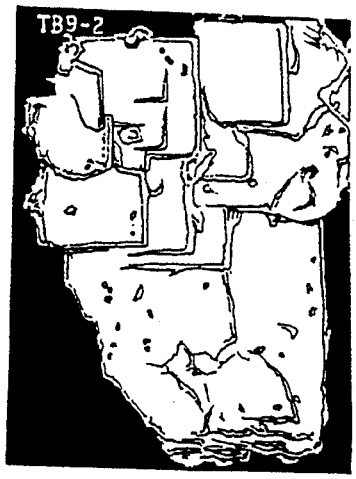

FIG. 16(a) is a photo of Scanning Electron Microscope of the single crystal of superconducting oxide shown in Table 3 and FIG. 16(b) is a photo of Scanning Electron Microscope of the single crystal of superconducting oxide of $(Tl, Bi)Sr_2Ca_2Cu_3O_w$ according to the present invention.

EXAMPLE 2

Single Crystal Growth of $(Tl, Bi, Pb)Sr_2Ca_2Cu_3O_w$

Powders of $Tl_2O_3$, $Bi_2O_3$, PbO, SrO, CaO and CuO were mixed in the following atomic ratios of $(Tl+Bi+Pb):Sr:Ca:Cu=2:2:(n-1):n$:

n=4, 5, 6 and 7 when Tl/(Bi+Pb)>1 and n=5, 6 and 7 when Tl/(Bi+Pb)=1.

The resulting powder mixture was packed in a tube made of gold.

After the gold tube was closed, the gold tube was placed in a furnace and was heated according to a heating program shown in the FIG. 1. The procedure was same as Example 1.

The critical temperature was determined by DC magnetic susceptibility measurement. Table 4 shows the result.

TABLE 4

| Tl/(Bi + Pb) >1 | | | | |
|---|---|---|---|---|
| n | 4 | 5 | 6 | 7 |
| critical temperature (K) | 109 | 110 | 108 | 107 |
| Tl/(Bi + Pb) = 1 | | | | |
| n | — | 5 | 6 | 7 |
| critical temperature (K) | — | 109 | 110 | 108 |

Figure 7:
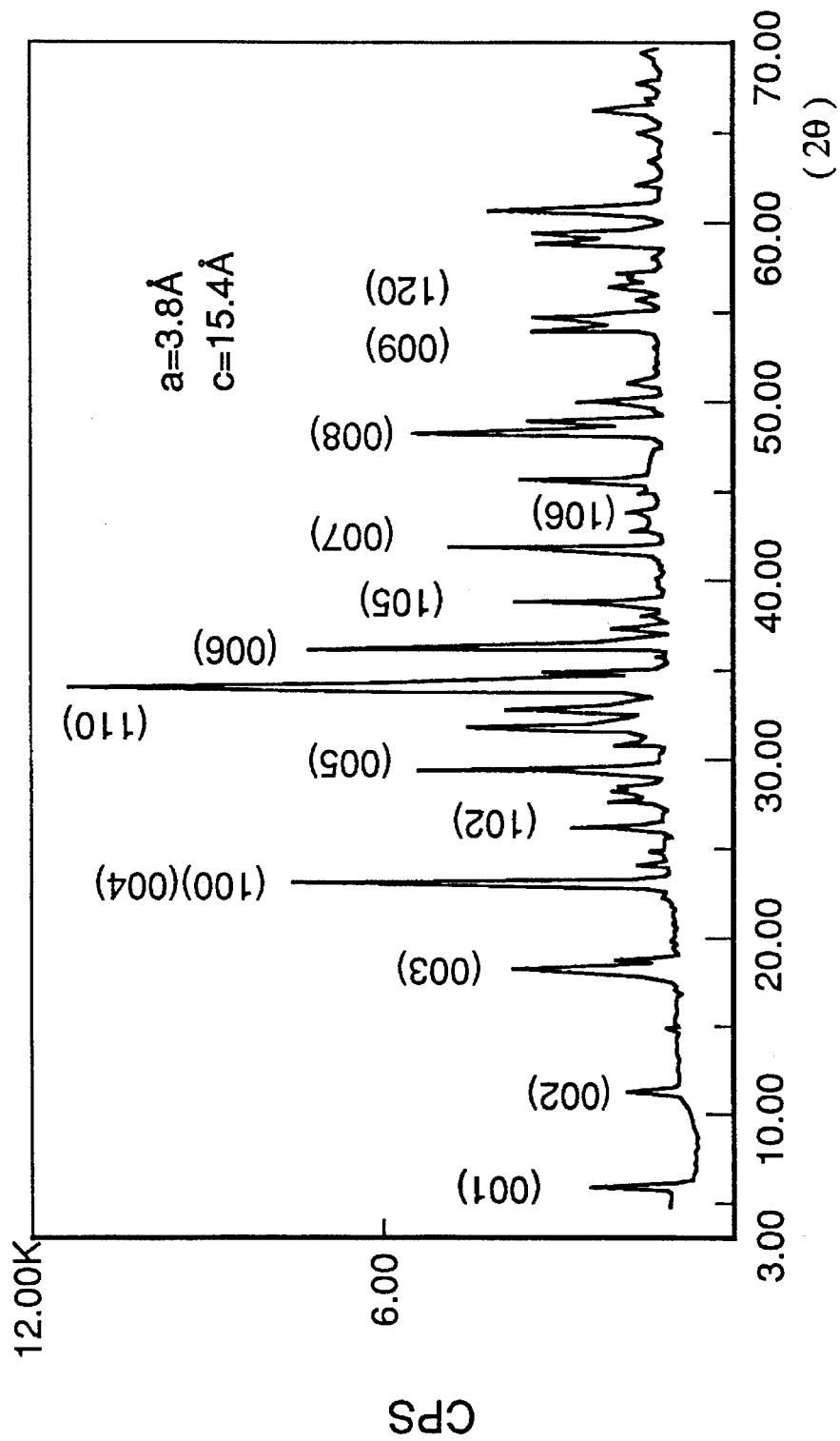
FIG. 7 is a X-ray diffraction chart of a high Tc phase of (Tl, Bi, Pb)$Sr_2Ca_2Cu_3O_w$ in the single crystal.

The resulting crystal was analyzed by a powder X-ray diffraction to find that the resulting crystal was a single crystal represented by $(Tl, Bi, Pb)_1Sr_2Ca_2Cu_3O_w$. FIG. 7 is a powder X-ray diffraction pattern obtained from a crystal of a typical sample.

Figure 8:
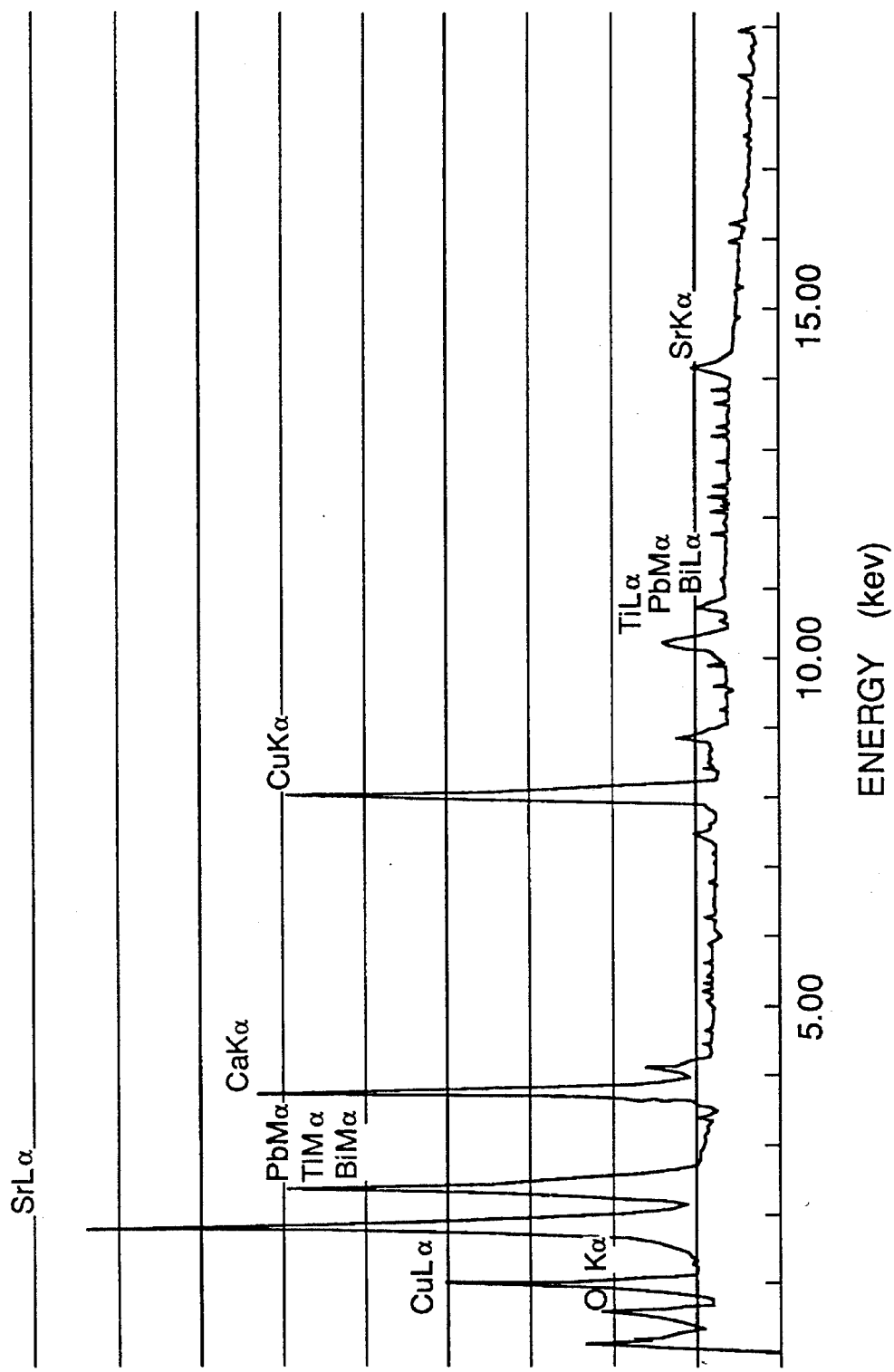
FIG. 8 is a chart obtained by an energy dispersive X-ray spectrometer and shows a composition of the high Tc phase of (Tl, Bi, Pb)$Sr_2Ca_2Cu_3O_w$ in the signle crystal.
Figure 9:
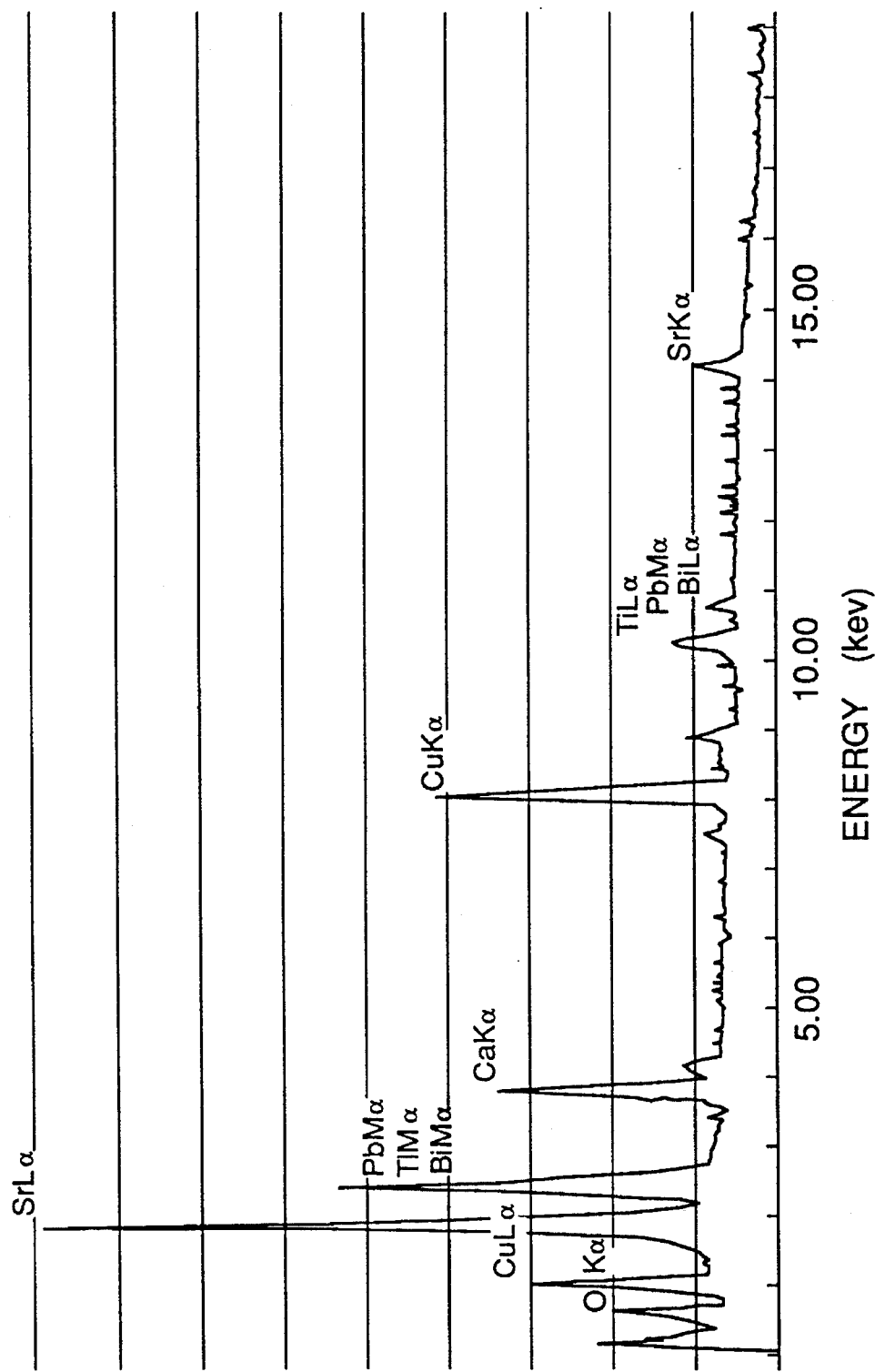
FIG. 9 is a chart obtained by an energy dispersive X-ray spectrometer and shows a composition of a low Tc phase of (Tl, Bi, Pb)$Sr_2Ca_2Cu_3O_w$ in the single crystal.

The composition of the resulting crystal was analyzed by an energy dispersive X-ray spectrometer. Table 5 shows a composition of the typical sample determined by the energy dispersive X-ray spectrometer and FIG. 8 is a pattern of the energy dispersive X-ray spectrometer of the sample.

TABLE 5

| Element | Tl | Bi | Pb | Sr | Ca | Cu |
|---|---|---|---|---|---|---|
| atomic ratio | 0.7 | 0.2 | 0.3 | 1.8 | 2.0 | 3.0 |

As comparative examples, the same procedure as above was repeated but the atomic ratios was changed as following:

$Tl/(Bi+Pb)=1$ and "n"=2, 3 and 4 and $Tl/(Bi+Pb)>1$ and "n"=3.

The resulting critical temperatures (K.) were relatively lower (75 to 85 K.). A composition of the crystal of the typical sample determined by an energy dispersive X-ray spectrometer is shown in Table 6.

TABLE 6

| Element | Tl | Bi | Pb | Sr | Ca | Cu |
|---|---|---|---|---|---|---|
| atomic ratio | 0.7 | 0.2 | 0.3 | 1.8 | 1.0 | 2.0 |

Figure 10:
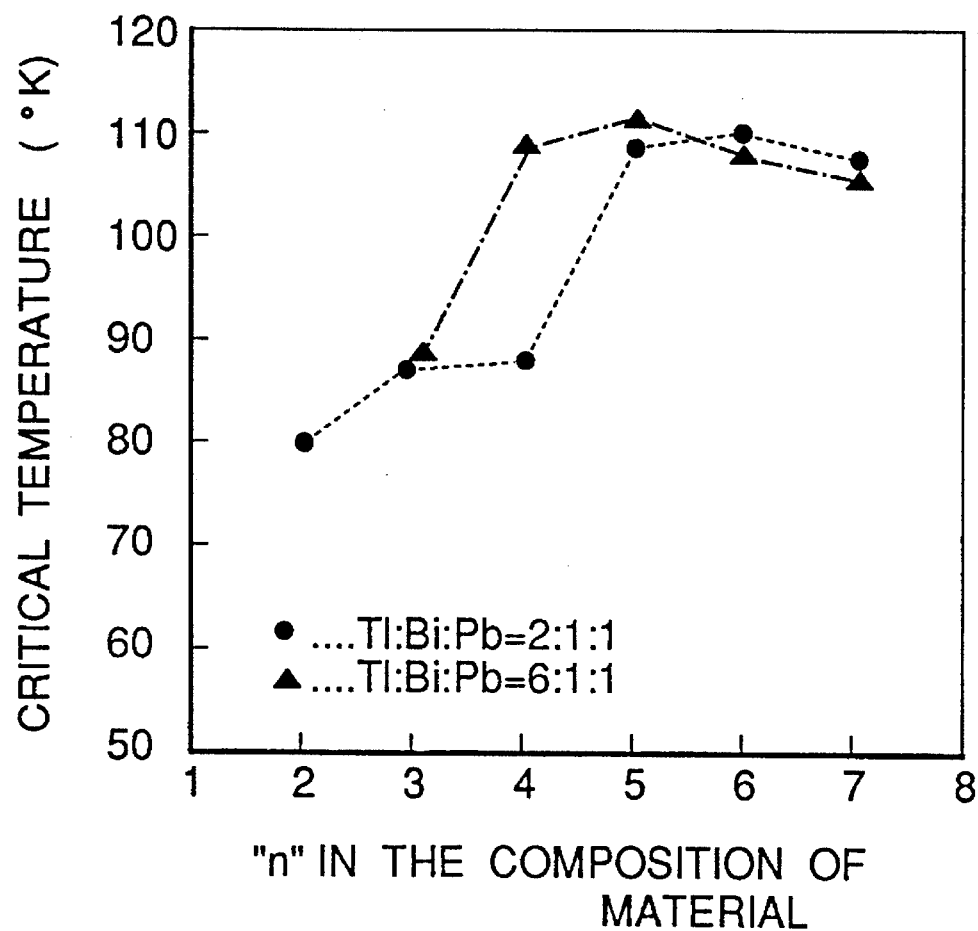
FIG. 10 shows a relation between the critical temperature (Tc) and a value "n" in a composition of (Tl, Bi, Pb)SrCaCuO system oxides.

FIG. 10 shows the relation between the critical temperatures (K.) with respect to a variation of the atomic ratios of Tl:Bi:Pb when the number of "n" is changed.

Figure 16C:
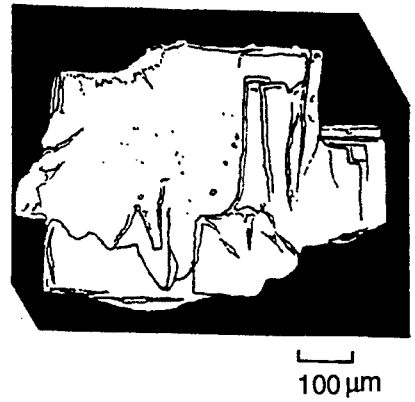
Figure 16D:

FIG. 16(c) is a photo of Scanning Electron Microscope of the single crystal of superconducting oxide shown in Table 6 and FIG. 16(d) is a photo of Scanning Electron Microscope of the single crystal of superconducting oxide of (Tl, Bi, Pb)$Sr_2Ca_2Cu_3O_w$ according to the present invention.

EXAMPLE 3

Preparation by Sintering Process

Oxide superconducting materials according to the present invention were prepared by sintering process.

Powders of $Tl_2O_3$, $Bi_2O_3$, PbO, CaO, SrO and CuO (purity is higher than 99.9%) used as materials were weighed and mixed in the proportions shown in Table 7 to Table 9 to prepare powder mixture samples. Then, the resulting powder mixture samples were compacted into pellets. The resulting each pellet was wrapped with a gold foil and was sintered at a temperature of 870° C. for 12 hours.

On the resulting oxide superconductors, the critical temperature and the critical current density at liquid nitrogen temperature were measured and X-ray diffraction charts were obtained in order to check phases produced. The value "q" in the general formula:

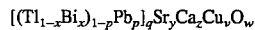

$[(Tl_{1-x}Bi_x)_{1-p}Pb_p]_qSr_yCa_zCu_vO_w$ was also determined in several samples. From these experimental data, it was confirmed that a novel tetragonal system layered crystal structure having a mixed layer of Tl and Bi or a mixed layer of Tl and Pb was produced in the resulting oxide superconductors. From the proportion of the phase obtained, it was concluded that this novel phase is a superconducting phase.

For a comparison, the same test as above was repeated for comparative superconducting materials which were prepared by sintering a powder mixture containing solely of $Bi_2O_3$, SrO, CaO and CuO and a powder mixture containing solely of $Bi_2O_3$, SrO, CaO, CuO and PbO.

Figure 11:
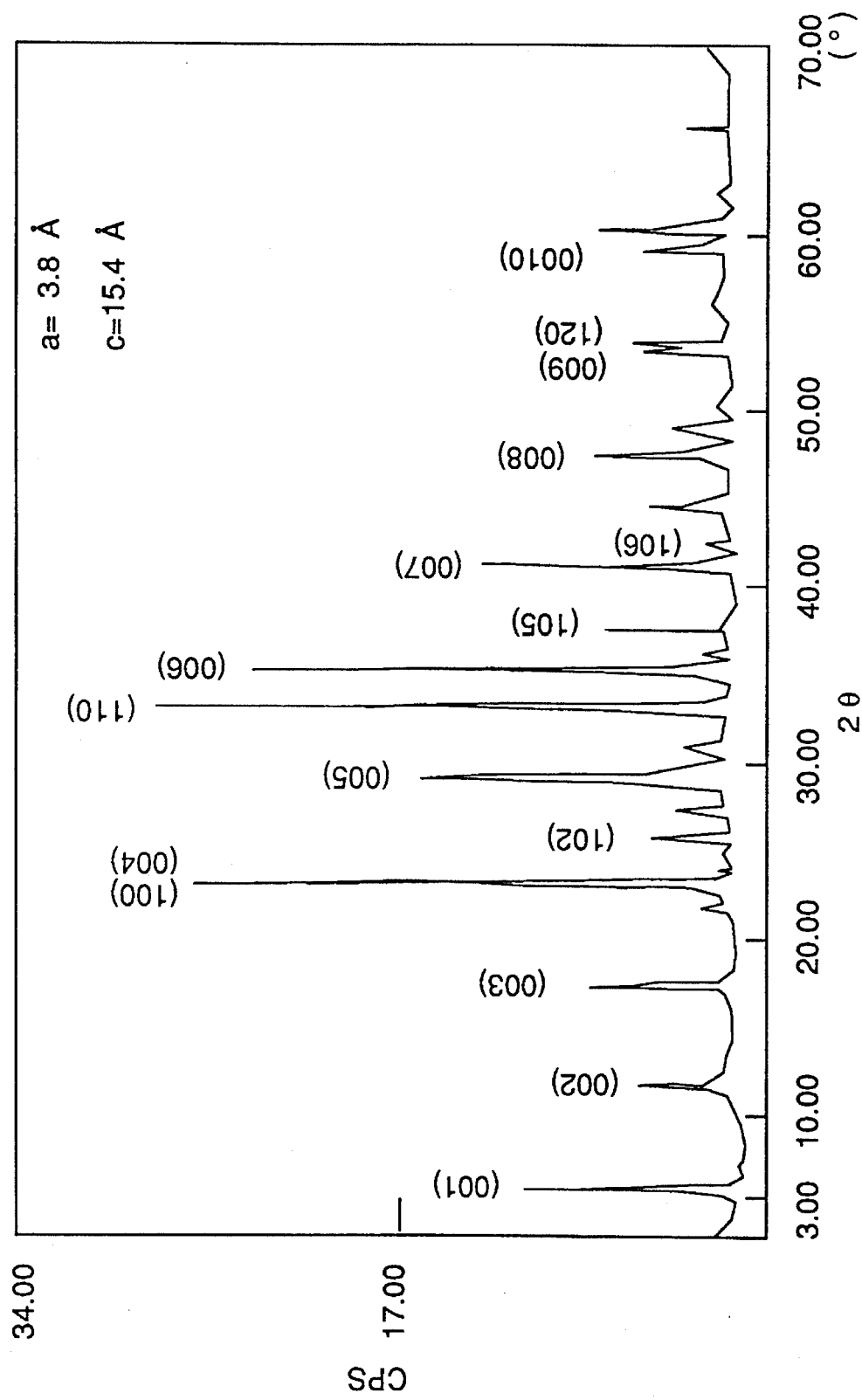
FIG. 11 is a X-ray diffraction chart obtained from Sample No. 3 in Example 1.
Figure 12:
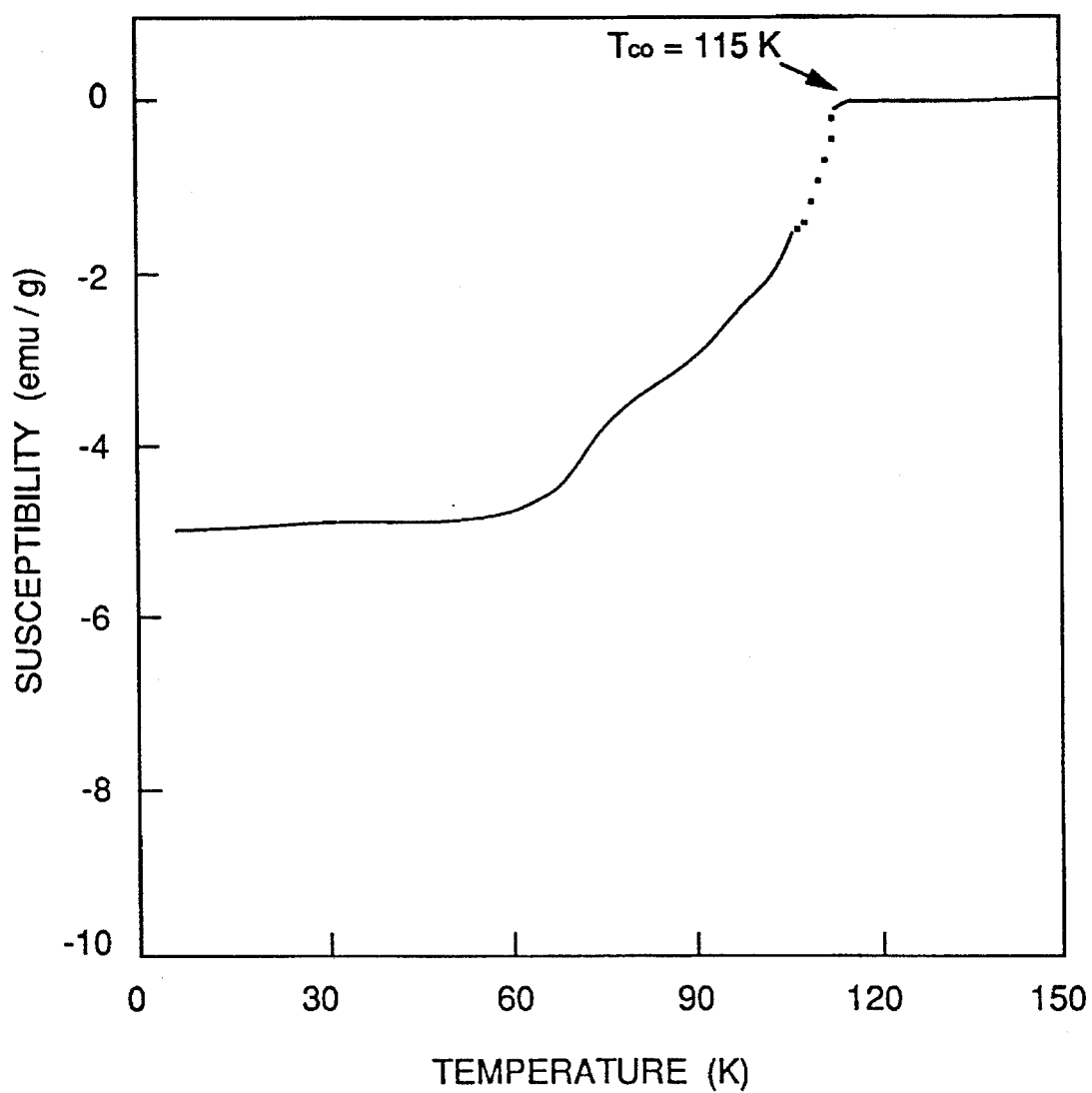
FIG. 12 and 13 show a temperature dependency of magnetic susceptibility and a temperature dependency of electric resistance of Sample No. 3 in Example 1 respectively.
Figure 13:
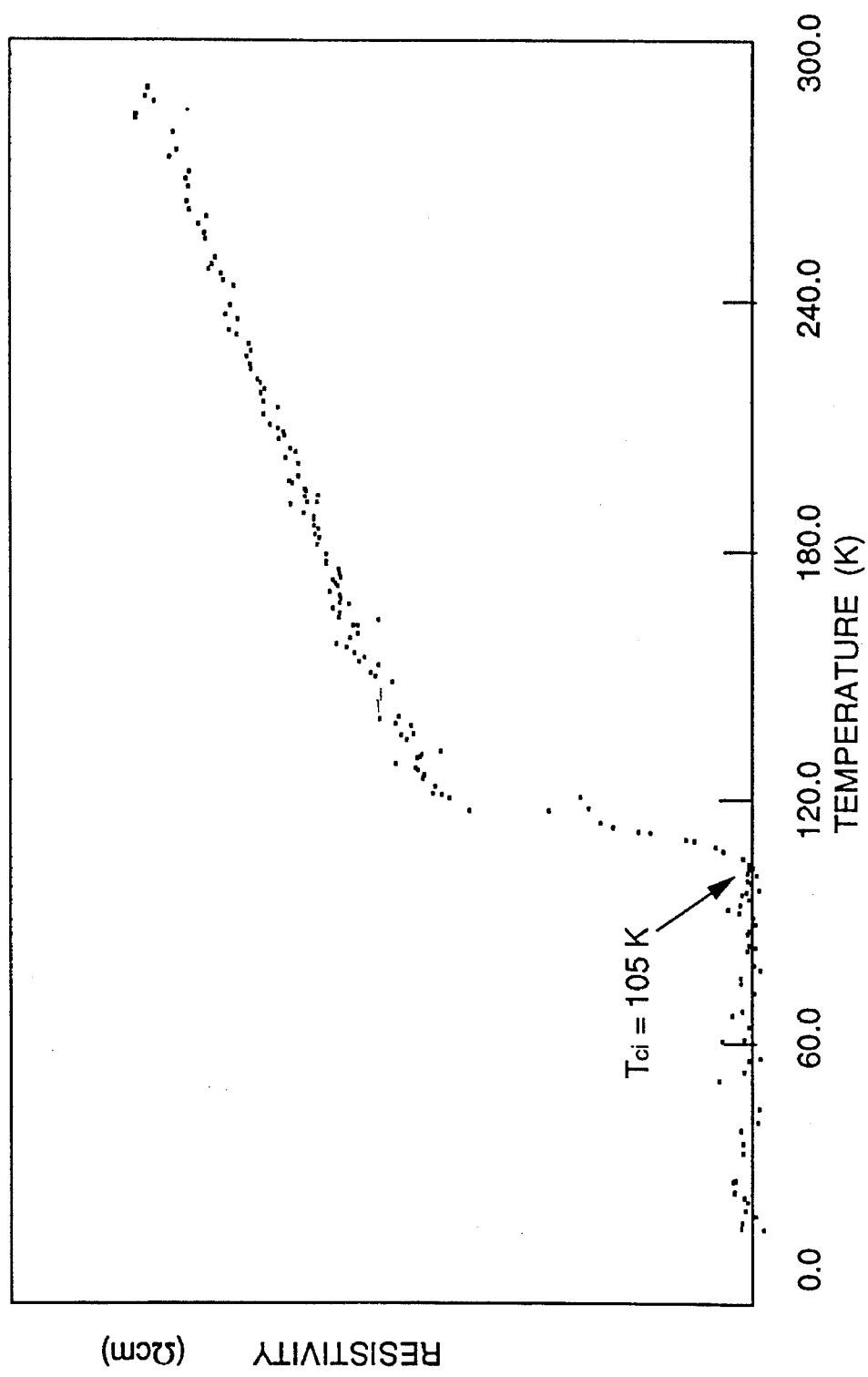

The ratios in the material powder mixture and the results of tests are also summarized in Table 7, 8 and 9. FIG. 11 shows a X-ray diffraction chart obtained from the sample No. 3. FIG. 12 shows respective temperature dependencies of electric resistance and of electric resistance measured on the sample No. 5.

All of the oxide superconducting materials according to the present invention show much higher critical current density Jc than the known oxide superconducting material while same or even higher critical temperature Tc is observed.

TABLE 7

| | | Composition of the powder mixture | | | | | | Tci | Jc |
|---|---|---|---|---|---|---|---|---|---|
| Sample No. | | Tl | Bi | Pb | Sr | Ca | Cu | (K) | (A/cm²) |
| Example | (1) | 0.7 | 0.3 | — | 2 | 2 | 3 | 100 | 450 |
| I | (2) | 0.6 | 0.4 | — | 2 | 2 | 3 | 105 | 550 |
| | (3) | 1 | 1 | — | 2 | 2 | 3 | 105 | 780 |
| | (4) | 0.6 | 0.3 | 0.1 | 2 | 2 | 3 | 108 | 650 |
| | (5) | 0.56 | 0.24 | 0.2 | 2 | 2 | 3 | 110 | 700 |
| | (6) | 0.42 | 0.18 | 0.4 | 2 | 2 | 3 | 113 | 750 |
| | (7) | 0.35 | 0.15 | 0.5 | 2 | 2 | 3 | 110 | 680 |
| | (8) | 0.28 | 0.12 | 0.6 | 2 | 2 | 3 | 108 | 650 |

Note:
Tci is a temperature where perfect zero resistance was observed The phase obtained was a tetragonal system having the lattice constant of a 3.8 Å and c = 15.3 Å in all samples prepared.

TABLE 8

| | | Composition of the powder mixture | | | | | | Tci | Jc |
|---|---|---|---|---|---|---|---|---|---|
| Sample No. | | Tl | Bi | Pb | Sr | Ca | Cu | (K) | (A/cm²) |
| Compa- | (9) | 0.21 | 0.09 | 0.7 | 2 | 2 | 3 | 80 | 90 |
| rative | (10) | 0.9 | 0.1 | — | 2 | 2 | 3 | 78 | 10 |
| Example | (11) | 0.1 | 0.9 | — | 2 | 2 | 3 | 80 | 100 |
| | (12) | 0 | 2 | — | 2 | 2 | 3 | 80 | 90 |
| | (13) | 1 | 0 | — | 2 | 2 | 3 | 75 | — |
| | (14) | 0 | 1.6 | 0.4 | 2 | 2 | 3 | 103 | 120 |
| Example | (15) | 0.7 | 0.3 | — | 2 | 1 | 2 | 86 | 120 |
| II | (16) | 0.6 | 0.4 | — | 2 | 1 | 2 | 90 | 150 |
| | (17) | 0.6 | 0.3 | 0.1 | 2 | 1 | 2 | 95 | 300 |
| Compa- | (18) | 0.9 | 0.1 | — | 2 | 1 | 2 | 78 | 10 |
| rative | (19) | 0.1 | 0.9 | — | 2 | 1 | 2 | 78 | 20 |
| Example | (20) | 0 | 2 | — | 2 | 1 | 2 | 78 | 20 |
| II | (21) | 1 | 0 | — | 2 | 1 | 2 | 75 | — |
| | (22) | 0 | 1.6 | 0.4 | 2 | 1 | 2 | 90 | 180 |

Note:
Tci is a temperature where perfect zero resistance was observed

TABLE 9

| | | Composition of the powder mixture | | | | | | Lattice constant (Å) | q | Tci (K) | Jc (A/cm²) |
|---|---|---|---|---|---|---|---|---|---|---|---|
| Sample No | | Bi | Tl | Pb | Sr | Ca | Cu | | | | |
| Example III | (23) | 0.8 | 1.2 | — | 2 | 2 | 3 | a = 3.8 c = 15.3 | 2 | 105 | 550 |
| Comparative | (24) | 2 | — | — | 2 | 2 | 3 | a = 5.41 c = 36.8 | — | 78 | 10 |

TABLE 9-continued

| Sample No | Composition of the powder mixture | | | | | | Lattice constant (Å) | q | Tci (K) | Jc (A/cm²) |
|---|---|---|---|---|---|---|---|---|---|---|
| | Bi | Tl | Pb | Sr | Ca | Cu | | | | |
| Example III (25) | 1.6 | — | 0.4 | 2 | 2 | 3 | a = 5.41<br>c = 30.6<br>a = 5.41<br>c = 35.8 | — | 103 | 120 |

Note:
Tci is a temperature where perfect zero resistance was observed

EXAMPLE 4

Preparation by Two-step Sintering Process

Superconducting compound oxide of $(Tl, Bi)Sr_2Ca_2Cu_3O_w$, was prepared by the two-step sintering technique according to the present invention.

Commercially available powders of $Tl_2O_3$, $Bi_2O_3$, $SrCO_3$, $CaCO_3$ and $CuO$ used as materials. At first, three powders of $SrCO_3$, $CaCO_3$ and $CuO$ were mixed in such proportions that the atomic ratios of Sr:Ca:Cu became as are shown in Table 10.

TABLE 10

| Sample No | Sr | Ca | Cu |
|---|---|---|---|
| I | 2 | 2 | 3 |
| II | 2 | 3 | 4 |
| a | 2 | 2 | 3 |
| b | 2 | 3 | 4 |

Each resulting powder mixture was compacted and was sintered at 850° C. for about 12 hours to obtain a compound oxide of Sr-Ca-Cu system (first sintering). Then, the sintered oxide was pulverized.

Then, commercially available powders of $Tl_2O_3$ and $Bi_2O_3$ were mixed with the pulverized oxide powder of Sr-Ca-Cu system in such proportions that the atomic ratios of Tl:Bi:Sr:Ca:Cu became as are shown in Table 11.

TABLE 11

| Sample No | Tl | Bi | Sr | Ca | Cu |
|---|---|---|---|---|---|
| I | 1.6 | 0.4 | 2 | 3 | 3 |
| II | 1.6 | 0.4 | 2 | 3 | 4 |
| a | 0.7 | 0.3 | 2 | 2 | 3 |
| b | 0.7 | 0.3 | 2 | 3 | 4 |

Each of the resulting powder mixtures was compacted and was sintered at 900° C. for about 6 hours to obtain a compound oxide of Tl-Bi-Sr-Ca-Cu system (second sintering).

The critical temperature (Tci) of the resulting compound oxide was determined by common four probe method. The volumetric percentage of the superconducting phase in the compound oxide was determined by magnetic susceptibility. The results are summarized in Table 12.

TABLE 12

| Sample No | Critical temp. Tci (K) | Volume of high Tc phase (%) |
|---|---|---|
| I | 115 | 30 |
| II | 116 | 28 |
| a | 112 | 25 |
| b | 113 | 20 |

It was confirmed by X-ray analysis that all of the resulting compound oxides of Tl-Bi-Sr-Ca-Cu system contained a superconducting phase represented by $(Tl_{0.7}, Bi_{0.3})Sr_2Ca_2Cu_2O_w$.

There was such a tendency that the percentage of the high Tc phase became higher when the material powder contained excess thallium and bismuth with respect to the composition of the resulting crystal.

EXAMPLE 5

Preparation by Two-steps Sintering Process

Superconducting compound oxide of $(Tl, Bi, Pb)Sr_2Ca_2Cu_3O_x$, was prepared by the same two-step sintering technique as Example 4 except the second sintering step.

Namely, in this Example, commercially available powders of $Tl_2O_3$, $Bi_2O_3$ and PbO were mixed with the pulverized oxide powder of Sr-Ca-Cu system obtained in the first sintering step in such proportions that the atomic ratios of Tl:Bi:Pb:Sr:Ca:Cu became as are shown in Table 13.

Each of the resulting powder mixtures was compacted and was sintered at 900° C. for about 6 hours to obtain a compound oxide of Tl-Bi-Pb-Sr-Ca-Cu system (second sintering).

The critical temperature (Tci) of the resulting compound oxide was determined by common four probe method. The volumetric percentage of the superconducting phase in the compound oxide was determined by magnetic susceptibility. The results are summarized in the Table 13.

TABLE 13

| Sample No | Atomic ratio | | | | | | Critical temp. Tci (K) | Volume of high Tc phase (%) |
|---|---|---|---|---|---|---|---|---|
| | Tl | Bi | Pb | Sr | Ca | Cu | | |
| I | 1.4 | 0.4 | 0.2 | 2 | 2 | 3 | 116 | 35 |
| II | 1.4 | 0.4 | 0.2 | 2 | 3 | 4 | 115 | 32 |
| a | 0.6 | 0.2 | 0.2 | 2 | 2 | 3 | 111 | 20 |
| b | 0.6 | 0.2 | 0.2 | 2 | 3 | 4 | 112 | 18 |

It was confirmed by X-ray analysis that all of the resulting compound oxides of Tl-Bi-Pb-Sr-Ca-Cu system contained a superconducting phase represented by the following formula:

$(Tl_{0.6}, Bi_{0.2}, Pb_{0.2})Sr_2 Ca_2Cu_2O_w$.

In this Example also, there was such a tendency that the percentage of the high Tc phase became higher when the material powder contained excess thallium and bismuth with respect to the composition of the resulting crystal.

As comparative examples, all of the material powders of (1) $Tl_2O_3$, $Bi_2O_3$, $SrCO_3$, $CaCO_3$ and CuO and (2) $Tl_2O_3$, $Bi_2O_3$, PbO, $SrCO_3$, $CaCO_3$ and CuO were mixed all together in the atomic ratios as are shown in Table 14 and Table 15 and were sintered in a sintering operation.

The resulting sintered products were analyzed by the same methods as above. The results obtained are summarized in the Table 14 and 15.

TABLE 14

| Sample | Atomic ratio | | | | Critical temp. | Volume of high |
|---|---|---|---|---|---|---|
| No | Tl | Bi | Sr | Ca | Cu | Tci (K) | Tc phase (%) |
| I | 1.6 | 0.4 | 2 | 2 | 3 | 100 | 18 |
| II | 1.6 | 0.4 | 2 | 3 | 4 | 103 | 15 |
| a | 0.8 | 0.2 | 2 | 2 | 3 | 85 | 7 |
| b | 0.9 | 0.2 | 2 | 3 | 4 | 83 | 5 |

TABLE 15

| Sample | Atomic ratio | | | | | | Critical temp. | Volume of high |
|---|---|---|---|---|---|---|---|---|
| No | Tl | Bi | Pb | Sr | Ca | Cu | Tci (K) | Tc phase (%) |
| I | 1.4 | 0.4 | 0.2 | 2 | 2 | 3 | 102 | 17 |
| II | 1.4 | 0.4 | 0.2 | 2 | 3 | 4 | 100 | 19 |
| a | 0.6 | 0.2 | 0.2 | 2 | 2 | 3 | 70 | 8 |
| b | 0.6 | 0.2 | 0.2 | 2 | 3 | 4 | 68 | 6 |

EXAMPLE 6

Evaluation (1) of Critical Current Density (Jc) in Strong Magnetic Field

Powders of $Tl_2O_3$, $Bi_2O_3$, PbO, CaO, SrO and CuO (purity is higher than 99.9%) were weighed and mixed in the following proportions to prepare powder mixture samples (i) and (ii):

Powder sample (i): Tl:Bi:Ca:Sr:Cu=1.6:0.4:2:2:3

Powder sample (ii): Tl:Bi:Pb:Ca:Sr:Cu=0.64: 0.16:0.2:2:4:5

Then, the resulting powder mixture samples were compacted into pellets. The resulting each pellet was wrapped with a gold foil and was sintered at a temperature of 860° C. for 12 hours.

The variation of the critical current density (Jc) was determined from magnetic hysterisis by varying the strength of external magnetic field from 0 T to 3 T in liquid nitrogen. Both oxides were analyzed by powder X-ray diffraction to find that the resulting oxides contained a novel layered crystal structure of tetragonal system consisting of one layer composed of a mixture of Tl, Bi and Pb and three layers of Cu-O. From the percentage of the novel layered crystal structure, it was revealed that the novel layered crystal structure contributed the superconductivity.

As comparative examples, the same test as above was repeated without using thallium oxide powder or bismuth oxide on the following comparative samples:

Comparative sample (i): Bi:Pb:Sr:Ca:Cu=0.8:0.2:1:1:1.5

Comparative sample (ii): Tl:Pb:Ca:Sr:Cu=1.8:0.2:3:2:4.

Figure 14:
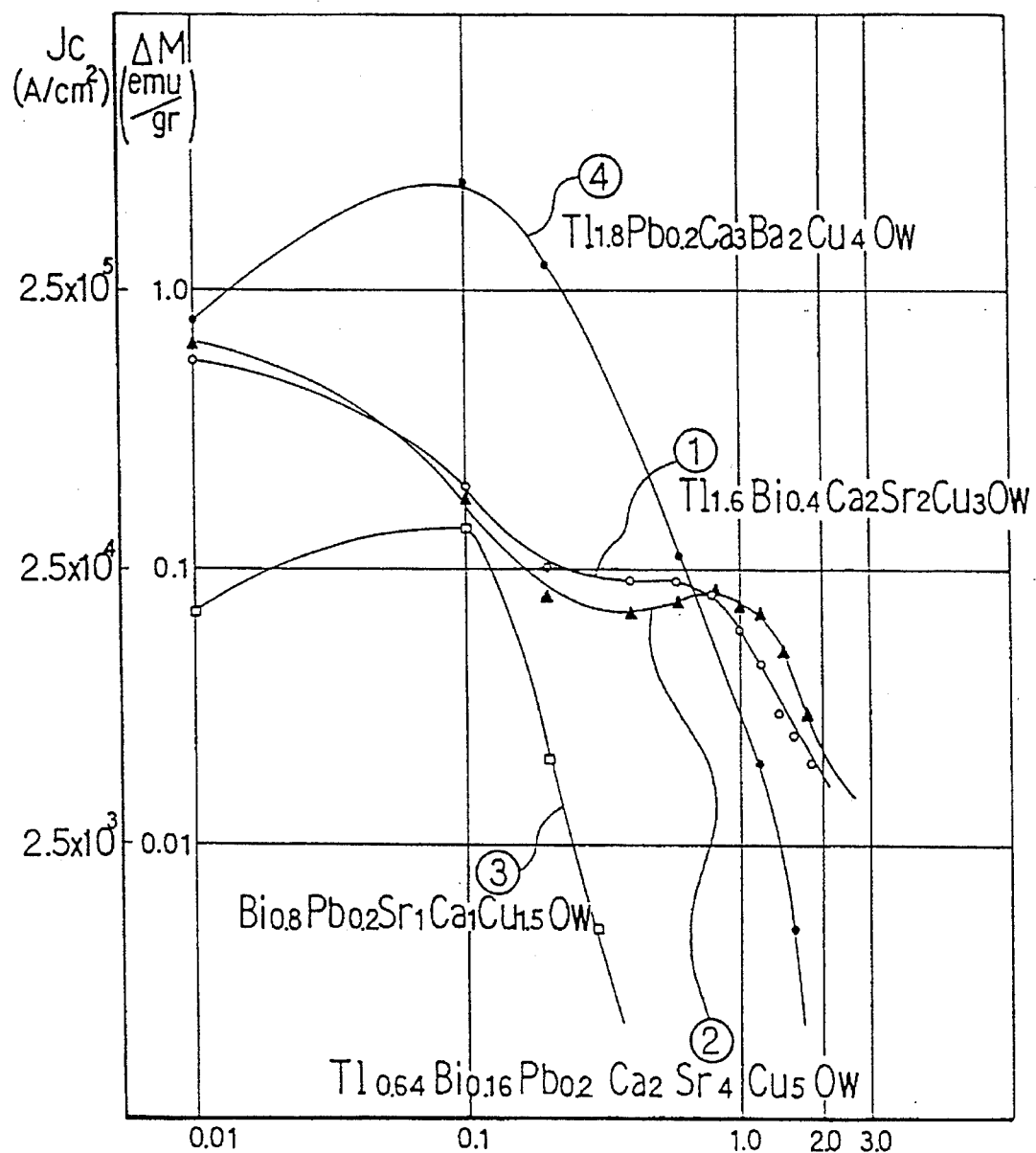
FIG. 14 is a graph showing a relation between the external magnetic field and the critical current density observed in the superconducting oxide materials of Tl-Bi-Sr-Ca-O system and Tl-Bi-Pb-Sr-Ca-O system according to the present invention and in known superconducting oxide materials of Tl-Pb-Sr-Ca-O system and Bi-Pb-Sr-Ca-O system.

The results are summarized in FIG. 14 in which a curve (1) corresponds to Sample (i) according to the present invention, a curve (2) corresponds to Sample (ii) according to the present invention, and curves (3) and (4) correspond to Comparative samples (i) and (ii) respectively.

The critical current density (Jc) of Sample (i) having a composition of $Tl_{1.6}Bi_{0.4}Ca_2Sr_2Cu_3O_y$ was calculated by following equation:

$$Jc=20(4\pi\Delta M)/r$$

in which "r" is a diameter of a crystal grain which was assumed to be equal to 10 μm.

From FIG. 14, it is apparent that the superconducting oxide material of Tl-Bi-(Pb)-Ca-Sr-Cu-O type doesn't change its critical current density even in the strong magnetic field above 1 T.

In addition to such improved resistance to strong magnetic fields, it was also confirmed that the superconducting oxide material according to the present invention exhibits an improved upper critical magnetic field ($H_{C2}$) by the measurement of resistance under the magnetic field. The superconducting oxide material according to the present invention exhibits the following values of $H_{C2}$:

| | $H_{C2}$ (0 K) | $H_{C2}$ (77 K) |
|---|---|---|
| Sample (i) | 212 T | 57 T |
| Sample (ii) | 228 T | 74 T |
| Comparative sample (i) | 99 T | 21 T |
| Comparative sample (ii) | 152 T | 48 T |

The values of $H_{C2}$ are calculated by WHH (Weathamer-Helfand-Hohenberg) theory. In the data, the critical temperature (Tc) is assumed as a temperature which corresponds to K.=$R_T/R_{TCO}$=0.7.

EXAMPLE 7

Evaluation (2) of Critical Current Density (Jc) in Strong Magnetic Field

Powders of $Tl_2O_3$, $Bi_2O_3$, PbO, CaO, SrO and CuO (purity is higher than 99.9%) were weighed and mixed in the following proportions to prepare powder mixture samples (i) and (ii):

Powder sample (i): Tl:Bi:Ca:Sr:Cu=1.6:0.4:2:2:3

Powder sample (ii): Tl:Bi:Pb:Ca:Sr:Cu= 0.64:0.16:0.2:2:4:5

Then, the resulting powder mixture samples were compacted into pellets. Each resulting pellet was wrapped with a gold foil and was sintered at a temperature of 900° C. for 6 hours.

The resulting sintered oxides showed the following critical temperature (Tc):

Sintered oxide from the powder sample (i): Tc=115 K

Sintered oxide from the powder sample (ii): Tc=117 K.

The variation of the critical current density (Jc) was determined from magnetic hysterisis by varying the strength of external magnetic field from 0 T to 3 T in liquid nitrogen. The result is shown in Table 16.

TABLE 16

| Magnetic field (Tesla) | Critical current density (A/cm²) | |
|---|---|---|
| | Oxide from (i) | Oxide from (ii) |
| 0 | $8 \times 10^4$ | $7.0 \times 10^4$ |
| 0.1 | $1.5 \times 10^4$ | $1.5 \times 10^4$ |
| 0.2 | $1 \times 10^4$ | $1 \times 10^4$ |
| 0.4 | $9 \times 10^3$ | $9 \times 10^3$ |
| 0.6 | $8 \times 10^3$ | $8 \times 10^3$ |
| 0.8 | $8 \times 10^3$ | $8 \times 10^3$ |
| 1.0 | $8 \times 10^3$ | $8 \times 10^3$ |
| 2.0 | $6 \times 10^3$ | $6 \times 10^3$ |
| 3.0 | $1 \times 10^3$ | $1 \times 10^3$ |

From the Table 16, it was revealed that the resulting Tl-Bi-(Pb)-Sr-Ca-Cu system superconducting oxides exhibited high critical current density (Jc) even under a strong magnetic field of 2 T.

Both oxides were analyzed by X-ray diffraction to find that the resulting oxides contained a novel layered crystal structure of tetragonal system consisting of one layer composed of a mixture of Tl, Bi and Pb and three layers of Cu-O. From the percentage of the novel layered crystal structure, it was revealed that the novel layered crystal structure contributed the superconductivity.

EXAMPLE 8

Application to Superconducting Wires

At first, powders of $SrCO_3$, $CaCO_3$ and CuO (purity is higher than 99.9%) were weighed and mixed in atomic ratios of Sr:Ca:Cu=2:2:3. The powder mixture was sintered at a temperature of 850° C. for 12 hours and the resulting sintered oxide was pulverized.

Then, powders of $Tl_2O_3$, $Bi_2O_3$ and PbO (purity is higher than 99.9%) were mixed with the pulverized powder in the following proportions to prepare powder mixture samples (i) and (ii):

Powder sample (i): Tl:Bi:Ca:Sr:Cu=1.6:0.4:2:2:3

Powder sample (ii): Tl:Bi:Pb:Ca:Sr:Cu=1.6:0.2:0.2:2:2:3

Then, the resulting powder mixture samples were compacted into pellets. The resulting each pellet was wrapped with a gold foil and was sintered secondarily at a temperature of 900° C. for 6 hours in oxygen stream.

Each of the resulting sintered oxides was pulverized and was packed in a pipe made of silver having an inner diameter of 4 mm and an outer diameter of 6 mm. The silver pipe filled with the sinter oxide powder was drawn through roller dies to reduce the outer diameter to 2 mm and then was rolled into a tape-shaped wire having a thickness of 0.15 mm.

The resulting tape-shaped wire was heat-treated at 880° C. for one hour in air. After then, the tape-shaped wire was further heat-treated under a load of 50 ton at 880° C. for another one hour period.

The critical temperature (Tc) was determined by usual four probe method.

Figure 15A:
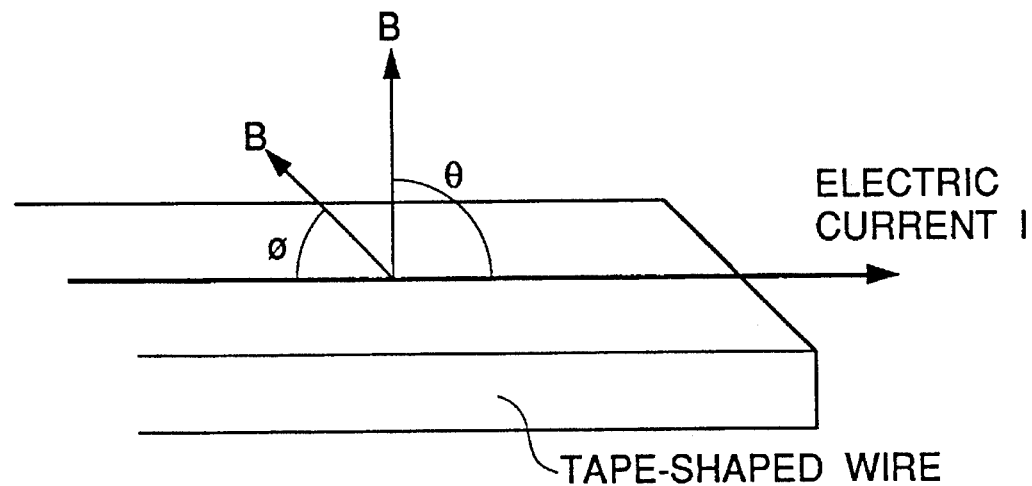
FIGS. 15($a$) and ($b$) an illustrative view for explaining the definition of the directions of magnetic field B (θ, φ).
Figure 15B:
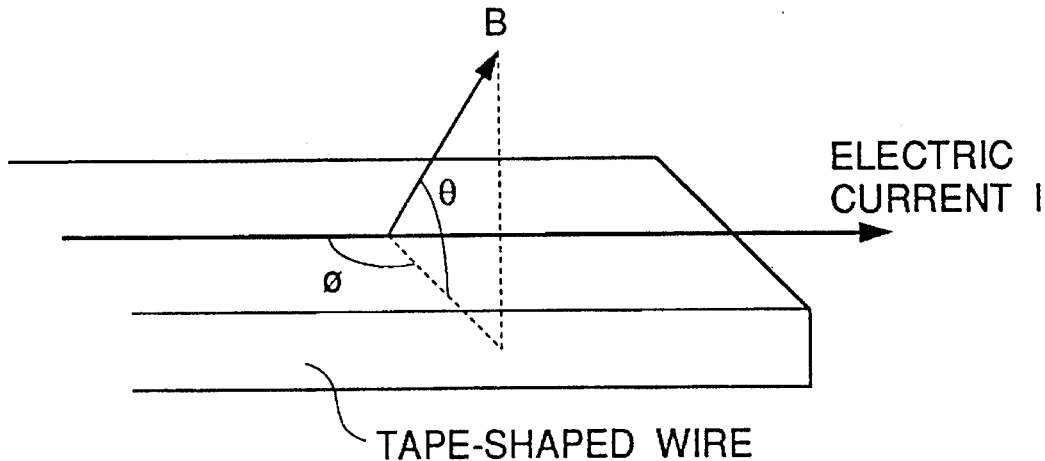

On the resulting wires, the dependency of the critical current density Jc (θ, φ) was determined as following:

Namely, the critical current density (Jc) was determined at 77.3 K with varying the strength and the direction of the magnetic field "B". The direction (θ, φ) of the magnetic field "B" was defined as is shown in FIGS. 15(a) and 15(b). Namely, the "θ" is an angle made between the direction of the magnetic field "B" and a plane in which the electric current "I" flow ($0 \leq \theta \leq 2\pi$) and "φ" is an angle between the magnetic filed "B" and the direction of the electric current "I" flow in the plane in which the current flow ($0 \leq \phi \leq 2\pi$).

The results are summarized in Table 17 and Table 18 in which $J_{max}$ is the highest critical current density under a selected magnetic field.

TABLE 17

The oxide from the sample (i)

Critical temperature 114 K

| Strength of magnetic field (Tesla) | Critical current density (A/cm²) | | |
|---|---|---|---|
| | $J_{max}$ | θ = 90° φ = 0° | θ = 0° φ = 90° |
| 0.0 | 2,800 | 2,800 | 2,800 |
| 0.1 | 300 | 280 | 290 |
| 0.2 | 250 | 240 | 230 |
| 0.4 | 240 | 220 | 220 |
| 0.8 | 240 | 220 | 210 |
| 1.0 | 230 | 220 | 200 |
| 2.0 | 220 | 220 | 210 |
| 3.0 | 150 | 130 | 140 |

TABLE 18

The oxide from the sample (ii)

Critical temperature 113 K

| Strength of magnetic field (Tesla) | Critical current density (A/cm²) | | |
|---|---|---|---|
| | $J_{max}$ | θ = 90° φ = 0° | θ = 0° φ = 90° |
| 0.0 | 2,700 | 2,700 | 2,700 |
| 0.1 | 320 | 310 | 320 |
| 0.2 | 240 | 250 | 240 |
| 0.4 | 230 | 220 | 220 |
| 0.8 | 220 | 200 | 210 |
| 1.0 | 200 | 210 | 200 |
| 2.0 | 210 | 200 | 190 |
| 3.0 | 140 | 120 | 130 |

From Table 17 and Table 18, it is apparent that superconducting wires produced from the superconducting materials according to the present invention maintain high critical current density (Jc $_{(B)}$) under strong magnetic field and satisfy the following condition:

$$0.5 \leq \frac{Jc_{(B)}}{Jc_{(0.2T)}} \leq 1.5$$

in which Jc $_{(0.2\,T)}$ is a critical current density at the intensity of magnetic field of 0.2 T while Jc $_{(B)}$ is a critical current density determined at any intensity (B) of magnetic field between 0.2 T≤B≤2 T.

From Table 17 and Table 18, it is also confirmed that the superconducting wire show is not sensitive to the direction of the magnetic field. The critical current density Jc (θ, φ) satisfy the following equation:

$$0.7 \leq \frac{Jc_{(\theta,\phi)}}{Jc_{max}} \leq 1$$

The oxides were analyzed by X-ray diffraction to find that the resulting oxides contained a novel layered crystal structure of tetragonal system consisting of one layer composed of a mixture of Tl, Bi and Pb and three layers of Cu-O. From the percentage of the the novel layered crystal structure, it was revealed that the novel layered crystal structure contributed the superconductivity.

EXAMPLE 9

Preparation of Tl-Bi-α-Sr-Ca-Cu-O System (α≠Pb)

In this example, an element α (α≠Pb) was added to the Tl-Bi-Sr-Ca-Cu-O system. In this example, $SnO_2$ was added in place of PbO or in addition of PbO ($SnO_2$/PbO=1/1).

Powders of $Tl_2O_3$, $Bi_2O_3$, PbO, $SnO_2$, CaO, SrO and CuO (purity is higher than 99.9%) used as materials were weighed and mixed in the proportions shown in Table 19 to prepare powder mixture samples. Then, the resulting powder mixture samples were compacted into pellets. The resulting each pellet was wrapped with a gold foil and was sintered at a temperature of 900° C. for 6 hours.

On the resulting oxide superconductors, the critical temperature (Tci, a temperature when resistance became zero) and the critical current density (Jc) at liquid nitrogen temperature were measured. The results are summarized in the Table 19.

X-ray diffraction analysis effected on the resulting sintered oxide superconductors revealed that they contain a layered crystal structure of tetragonal system having one layer of (Tl, α)-O, (Tl, Bi)-O or (Tl, Bi, α)-O. In all samples obtained, the lattice constant is a=3.8 Å and c=15.3 Å.

Micro-analysis revealed that Bi and the element α as well as Tl, Sr, Ca and Cu are dissolved in a form of a sold solution in a superconducting phase.

For comparison, the same procedure as above was repeated for two powder samples composed simply of $Tl_2O_3$, $Bi_2O_3$, CaO, SrO and CuO. The resulting sintered oxides were evaluated by the same method as above. The results obtained as well as the composition of the material powder are shown in the Table 19 as Sample No. 15 and 16.

In the Table 19, Sample No. 1 to 3 contain Pb as the element α, Sample No. 4 to 6 contain Sn as the element α, Sample No. 7 to 9 contain Pb+Sn (Pb/Sn=1) as the element α. Sample No. 3, 6 and 9 which are marked by "*" suggest such a fact that excessive amounts of the element α deteriorate the superconducting properties.

Table 20 show the composition of the crystals contained in the superconducting material obtained.

TABLE 19

| Sample No | atomic ratio | | | | | | Tci (K) | Jc (A/cm²) |
|---|---|---|---|---|---|---|---|---|
| | Tl | Bi | Pb | Sr | Ca | Cu | | |
| 1 | 0.7 | 0.2 | 0.1 | 2 | 2 | 3 | 115 | 700 |
| 2 | 0.5 | 0.2 | 0.3 | 2 | 2 | 3 | 116 | 720 |
| 3* | 0.3 | 0.2 | 0.5 | 2 | 2 | 3 | 80 | 200 |
| | Tl | Bi | Sn | Sr | Ca | Cu | | |
| 4 | 0.7 | 0.2 | 0.1 | 2 | 2 | 3 | 115 | 680 |
| 5 | 0.5 | 0.2 | 0.3 | 2 | 2 | 3 | 115 | 720 |
| 6* | 0.3 | 0.2 | 0.5 | 2 | 2 | 3 | 90 | 300 |
| | Tl | Bi | Pb + Sn | Sr | Ca | Cu | | |
| 7 | 0.7 | 0.2 | 0.1 | 2 | 2 | 3 | 115 | 680 |
| 8 | 0.5 | 0.2 | 0.3 | 2 | 2 | 3 | 116 | 700 |
| 9* | 0.5 | 0.2 | 0.5 | 2 | 2 | 3 | 85 | 250 |
| | Tl | Bi | Sn | Sr | Ca | Cu | | |
| 10 | 1.3 | 0.3 | 0.4 | 2 | 2 | 3 | 115 | 700 |
| 11 | 1.3 | 0.3 | 0.4 | 2 | 3 | 4 | 114 | 650 |
| 12 | 1.3 | 0.3 | 0.4 | 2 | 4 | 5 | 115 | 730 |
| 13 | 0.6 | 0.2 | 0.2 | 2 | 3 | 4 | 116 | 750 |
| 14 | 0.6 | 0.2 | 0.2 | 2 | 4 | 5 | 114 | 680 |
| | Tl | Bi | — | Sn Sr | Ca | Cu | | |
| 15* | 0.7 | 0.3 | — | 2 2 | 3 | | 110 | 400 |
| 16* | 1.6 | 0.4 | — | 2 3 | 4 | | 112 | 450 |

TABLE 20

| Sample No | Composition of the crystals |
|---|---|
| 1 | $Tl_{0.7}Bi_{0.2}Pb_{0.1}Sr_2Ca_2Cu_3O_w$ |
| 2 | $Tl_{0.7}Bi_{0.2}Pb_{0.2}Sr_2Ca_2Cu_3O_w$ |
| 4, 10 to 14 | $Tl_{0.7}Bi_{0.2}Sn_{0.1}Sr_2Ca_2Cu_3O_w$ |
| 5 | $Tl_{0.7}Bi_{0.2}Sn_{0.2}Sr_2Ca_2Cu_3O_w$ |
| 7 | $Tl_{0.7}Bi_{0.2}Pb_{0.05}Sn_{0.05}Sr_2Ca_2Cu_3O_w$ |
| 8 | $Tl_{0.7}Bi_{0.2}Pb_{0.1}Sn_{0.1}Sr_2Ca_2Cu_3O_w$ |
| 15 | $Tl_{0.7}Bi_{0.2}Sr_2Ca_2Cu_3O_w$ |

Table 19 reveals such a fact that addition of the element α increases the critical current density without spoiling the critical temperature. It is thought that the elements α selected from a group consisting of In, Sn, Sb, Pb, Y and lanthanide elements facilitate formation of a single phase but function merely as a catalyst, so in such cases the elements α does not constitute a constituent element in the superconducting material obtained, or a part of the elements α constitutes a constituent element in the superconducting material obtained.

EXAMPLE 10

Wire Produced by the Two-steps Sintering

Commercially available powders of $Tl_2O_3$, $Bi_2O_3$, $CaCO_3$, $SrCO_3$ and CuO were used as material powders.

At first, powders of $CaCO_3$, $SrCO_3$ and CuO were mixed and sintered at a temperature of 850° C. for 12 hours (first sintering step). After the resulting sintered oxide was pulverized, powders of $Tl_2O_3$ and $Bi_2O_3$ were mixed to the pulverized powder in atomic ratios of Tl:Bi:Sr:Ca:Cu= 1.6:0.4:2:2:3. Then, the resulting powder mixture samples were compacted into pellets. Each resulting pellet was wrapped with a gold foil and was sintered at a temperature of 900° C. for 6 hours in oxygen stream (second sintering).

Each of the resulting sintered oxides was pulverized and was packed in a pipe made of silver having an inner diameter of 4 mm and an outer diameter of 6 mm. The silver pipe fill with the sinter oxide powder was drawn through roller dies to reduce the outer diameter to 2 mm and then was rolled into a tape-shaped wire having a thickness of 0.15 mm.

The resulting tape-shaped wire was heat-treated at 900° C. for 30 minutes in oxygen stream (first heat-treatment). After then, the tape-shaped wire was subjected to plastic deformation under a selected load listed in Table 21. Then, the deformed wire was heat-treated secondly at 900° C. for 30 minutes.

The critical temperature (Tc) was determined by usual four probe method and the critical current density (Jc) was measured at 77.3 K.

The same procedure as above was repeated except the fist heat-treatment was omitted (Sample No. 7 to 12) and except all heat-treatments were omitted (Comparative sample No. 13).

The results are summarized in Table 21 in which Sample No. 1 to 6 are the products which are subjected to the first and second heat-treatment.

TABLE 21

| Sample No | load (ton/cm$^2$) | Critical temp. (K) | Critical current density (A/cm$^2$) |
|---|---|---|---|
| 1 | 1 | 110 | 1,800 |
| 2 | 10 | 113 | 2,300 |
| 3 | 20 | 114 | 3,000 |
| 4 | 50 | 115 | 3,500 |
| 5 | 80 | 114 | 5,500 |
| 6 | 100 | 114 | 7,500 |
| 7 | 1 | 111 | 1,800 |
| 8 | 10 | 113 | 2,200 |
| 9 | 20 | 114 | 3,200 |
| 10 | 50 | 114 | 4,000 |
| 11 | 80 | 113 | 5,500 |
| 12 | 100 | 114 | 7,500 |
| 13 | — | 110 | 400 |

Then, the same procedure as above was repeated for another oxide system in which a portion of (Tl+Bi) was replaced by Pb. In this case, powders of PbO was used as a source of Pb and the atomic ratios of Tl:Bi:Pb:Sr:Ca:Cu was adjusted to 1.5:0.3:0.2:2:2:3.

The same procedure as above was repeated and the resulting superconducting wires were evaluated by the same method as above.

The load applied in the plastic deformation stage, the critical temperature (Tc) and the critical current density (Jc) are summarized in Table 22 in which Sample No. 14 to 26 correspond to sample No. 1 to 13 in the Table 21.

TABLE 22

| Sample No | load (ton/cm$^2$) | Critical temp. (K) | Critical current density (A/cm$^2$) |
|---|---|---|---|
| 14 | 1 | 111 | 1,200 |
| 15 | 10 | 114 | 2,000 |
| 16 | 20 | 113 | 3,500 |
| 17 | 50 | 114 | 4,000 |
| 18 | 80 | 115 | 5,500 |
| 19 | 100 | 113 | 8,000 |
| 20 | 1 | 110 | 1,000 |
| 21 | 10 | 115 | 1,300 |
| 22 | 20 | 113 | 3,400 |
| 23 | 50 | 114 | 4,500 |
| 24 | 80 | 113 | 5,200 |
| 25 | 100 | 114 | 7,000 |
| 26 | — | 110 | 300 |

The results reveal that the wires according to the present invention are superior to comparative example in critical current density and that the critical current density is improved when the wires are subjected to a load of higher than 10 ton/cm$^2$, more preferably 20 ton/cm$^2$.

We claim:

1. Superconducting oxide material consisting essentially of compound oxide having the composition represented by the formula:

$$[(Tl_{1-x}Bi_x)_{1-p}\alpha_p]_q Sr_y Ca_z Cu_v O_w$$

in which "α" is at least one element selected from the group consisting of In, Sn, Sb, Pb, Y and lanthanide elements; "x" and "p" are numbers each satisfying the following respective ranges: $0.1 \leq x \leq 0.5$ and $0 \leq p \leq 0.6$, "q" is about 1, "y" is about 2, "z" is about 2, "v" is about 3 and "w" is about 9.

2. The superconducting oxide material set forth in claim 1 wherein said superconducting oxide material exhibits high critical current density in a strong magnetic field.

3. The superconducting oxide material set forth in claim 1 wherein the oxide of said superconducting oxide material is composed of a layered crystal structure of a tetragonal system.

4. The superconducting oxide material set forth in claim 1 wherein the superconducting oxide material exhibits the critical current density Jc $_{(B)}$ which satisfies the following equation:

$$0.5 \leq \frac{Jc_{(B)}}{Jc_{(0.2T)}} \leq 1.5$$

in which Jc $_{(0.2\ T)}$ is a critical current density determined when the intensity of magnetic field is 0.2 T while Jc $_{(B)}$ is a critical current density determined at any intensity (B) of magnetic field between 0.2 T $\leq$ B $\leq$ 2 T.

5. A superconducting elongated article made of the superconducting oxide material set forth in claim 1 wherein the superconducting oxide material exhibits the critical current density Jc$_{-(\Theta,\Phi)}$ which satisfies the following equation:

$$0.7 \leq \frac{Jc_{(\theta,\phi)}}{Jc_{max}} \leq 1$$

in which Jc$_{-(\Theta,\Phi)}$ is a critical current density determined at any intensity of magnetic field B($\theta,\phi$) while Jc $_{max}$ is the highest critical current density at the same intensity of magnetic field, wherein the magnetic field B ($\theta\phi$) is defined as a magnetic field applied to the elongated article from any direction, $\theta$ being an angle between the magnetic filed and a plane in which the current flow ($0 \leq \theta \leq 2\pi$) and $\phi$ being an angle between the magnetic filed and the direction of current flow in the plane in which the current flow ($0 \leq \phi \leq 2\pi$).

6. A magnet including the superconducting elongated article made of the superconducting oxide material set forth in claim 1.

7. The superconducting oxide material set forth in claim 1 wherein "α" is Pb.

8. The superconducting oxide material set forth in claim 1 wherein "p" is zero.

* * * * *